United States Patent [19]
Hatakeyama et al.

[11] Patent Number: 5,852,298
[45] Date of Patent: Dec. 22, 1998

[54] MICRO-PROCESSING APPARATUS AND METHOD THEREFOR

[75] Inventors: Masahiro Hatakeyama; Katsunori Ichiki, both of Fujisawa; Takao Kato, Tokyo; Masaaki Kajiyama, Yokohama; Takashi Tsuzuki, Tokyo; Yotaro Hatamura, 2-12-11 Kohinata, Bunkyo-ku, Tokyo; Masayuki Nakao, Matsudo, all of Japan

[73] Assignees: Ebara Corporation; Yotaro Hatamura, both of Tokyo, Japan

[21] Appl. No.: 621,990

[22] Filed: Mar. 26, 1996

[30] Foreign Application Priority Data

Mar. 30, 1995 [JP] Japan .................................. 7-097932
Mar. 30, 1995 [JP] Japan .................................. 7-097933
Mar. 30, 1995 [JP] Japan .................................. 7-097934
Feb. 8, 1996 [JP] Japan .................................. 8-046632

[51] Int. Cl.$^6$ .................................................. H01J 37/00
[52] U.S. Cl. ................................... 250/492.2; 250/442.11
[58] Field of Search .............................. 250/492.2, 492.3, 250/398, 400, 306, 307, 310, 440.11, 442.11

[56] References Cited

U.S. PATENT DOCUMENTS

| | | | |
|---|---|---|---|
| 4,663,511 | 5/1987 | Tallman ............................. | 219/121 EC |
| 4,843,563 | 6/1989 | Takahashi et al. .................... | 250/492.2 |
| 4,849,901 | 7/1989 | Shimizu ............................... | 250/492.2 |
| 5,123,174 | 6/1992 | Noguchi ................................. | 33/568 |
| 5,142,145 | 8/1992 | Yasutake .............................. | 250/306 |
| 5,164,596 | 11/1992 | Noguchi et al. ....................... | 250/492.2 |
| 5,229,607 | 7/1993 | Matsui et al. ........................... | 250/306 |

FOREIGN PATENT DOCUMENTS

| | | |
|---|---|---|
| 0 200 333 | 12/1986 | European Pat. Off. . |
| 0 654 813 | 5/1995 | European Pat. Off. . |
| 38 02 598 | 4/1989 | Germany . |
| 42 26 694 | 2/1993 | Germany . |

OTHER PUBLICATIONS

Fusao Shimokawa et al., "Reactive–fast–atom beam etching of GaAs using $Cl_2$ gas", J. Appl. Phys. 66(6), 15 Sep. 1989, published by 1989 American Institute of Physics, 1989, pp. 2613–2618.

Tetsuro Nakamura et al., "Fabrication Technology of Integrated Circuit", published by Sangyo Tosho Publishing Company (Japan), 1987, pp. 21–23 (includes English translation).

Masayuki Nakao et al., "3–dimensional Handling in Nano Manufacturing World", Proceedings of 71st Fall annual meeting of the Japan Society of Mechanical Engineers, published by the Japan Society of Mechanical Engineers, 1993, vol. F, pp. 273–275 (includes English Abstract).

Masayuki Nakao et al., "Realization of 3–D Manufacturing in Nano Manufacturing World", Proceedings of 71st Spring annual meeting of the Japan Society of Mechanical Engineers, published by the Japan Society of Mechanical Engineers, 1993, vol. IV, pp. 485–486 (includes English Abstract).

(List continued on next page.)

*Primary Examiner*—Kiet T. Nguyen
*Attorney, Agent, or Firm*—Wenderoth, Lind & Ponack, LLP

[57] ABSTRACT

A micro-working apparatus performs fabrication and assembly tasks for micron/nanometer sized objects while progress of operations is observed in real-time by at least a pair of optical or electron microscopes to provide simultaneous views from at least two directions. This offers spatial visual information regarding the working space which is particularly critical in micro-working. Micro-working is further facilitated by the use of a micro-pallet device specially designed for use in the apparatus, but also offering other application possibilities. Rotational and parallel translation movements provided by the micro-pallet combined with the micro-working capability of the apparatus are utilized to enable production of micron-sized parts for use in advanced applications of optical and electronic devices.

32 Claims, 21 Drawing Sheets

OTHER PUBLICATIONS

Patent Abstracts of Japan, vol. 013, No. 220 (E–762), 23 May 1989 & JP 01 033838 A (Nissin Electric Co. Ltd.), 3 Feb. 1989, * Abstract *.

Kenny, M.J. et al.: "A Universal Sample Manipulator with 50 DV Negative Bias" Nuclear Instruments & Method in Physics Research, Section –B: Beam Interactions with Materials and Atoms, vol. B55, No. 1/04, 2 Apr. 1991, pp. 522–526, XP000230730 * p. 523, col. 1, paragraph 2 –col. 2, paragraph 1 *.

"Manipulator for a Vacuum Chamber" NTIS Tech Notes, 1 Mar. 1989, p. 187 XP000117729* the whole document *.

Patent Abstracts of Japan, vol. 007, No. 094 (E–171), 20 Apr. 1983 & JP 58 018850 A (Hitachi Seisakusho KK), 3 Feb. 1983 * Abstract *.

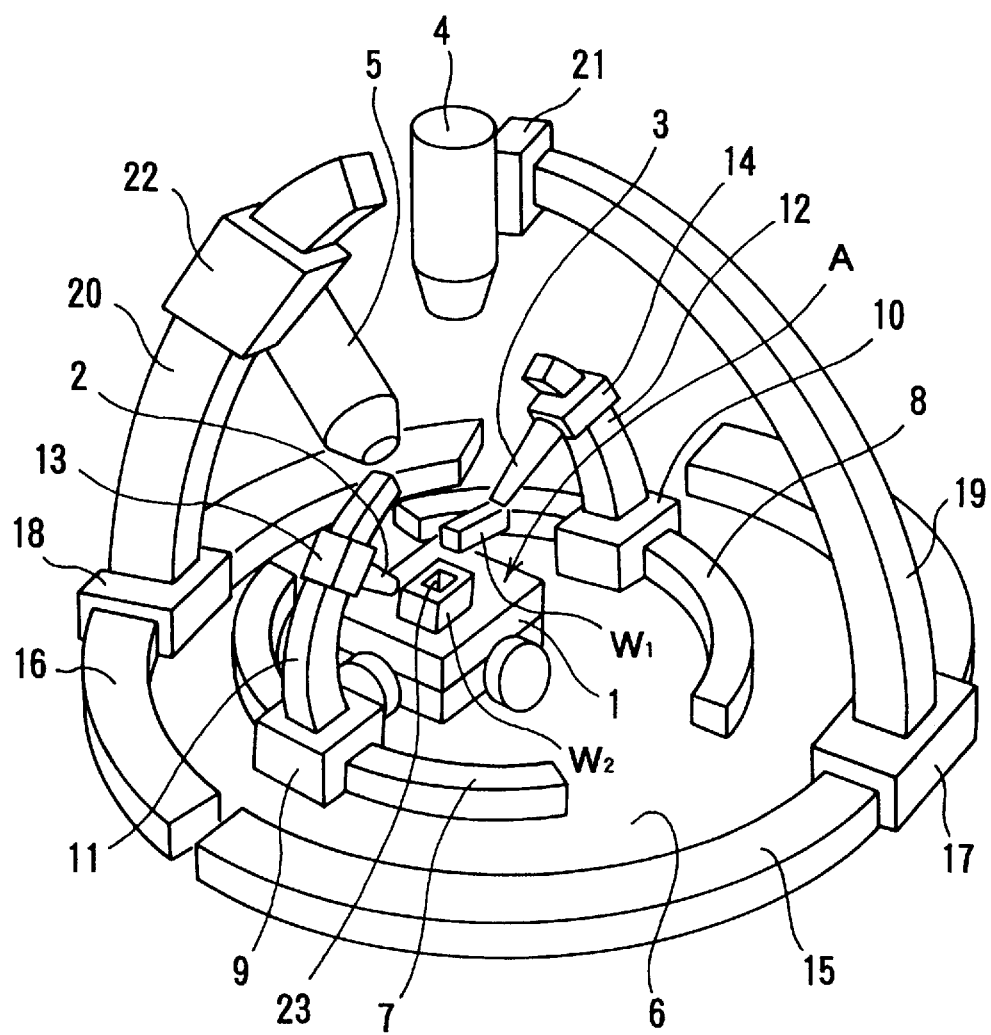
F I G. 1

F I G. 2
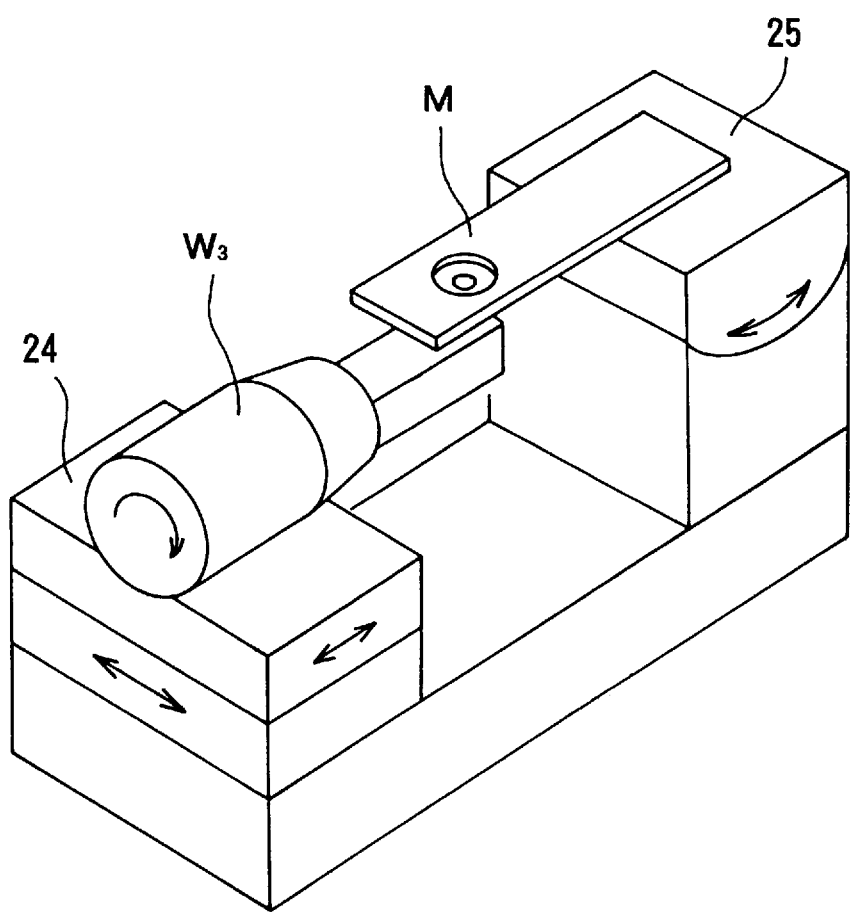

F I G. 5
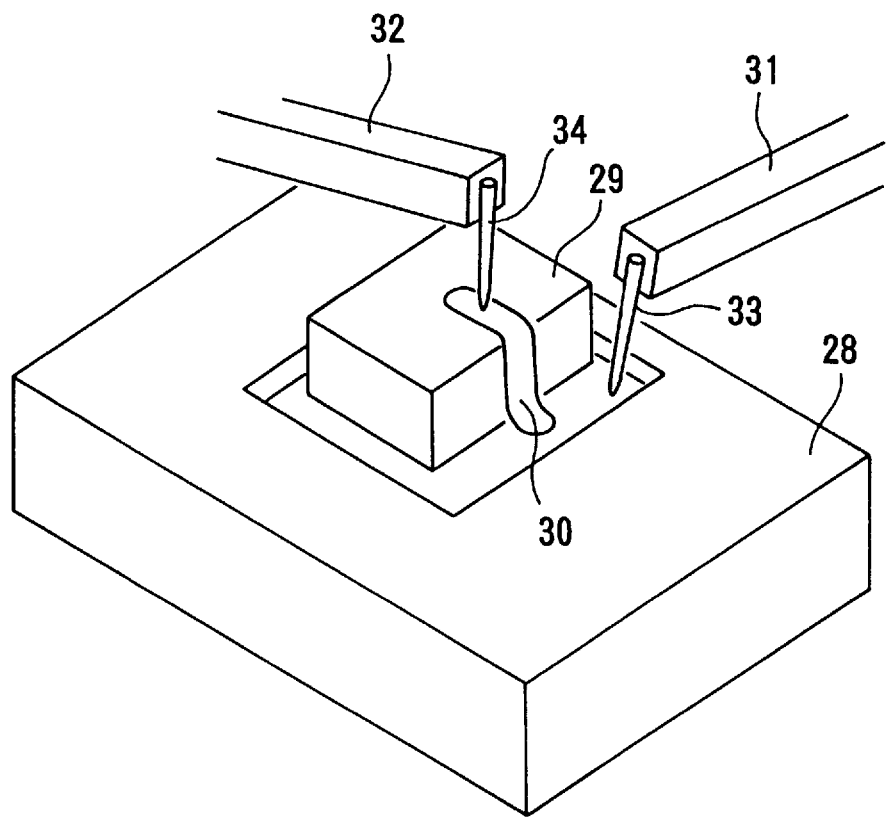

F I G. 7
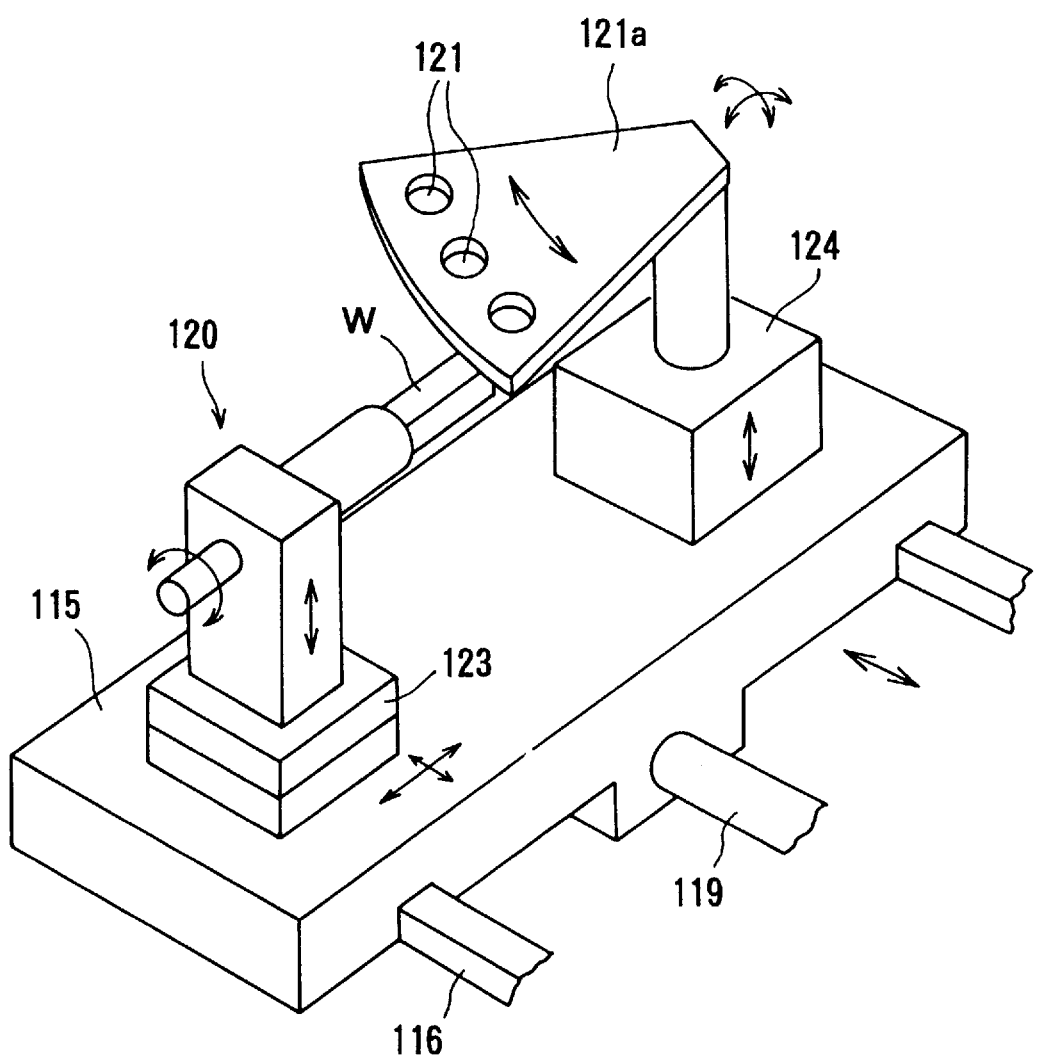

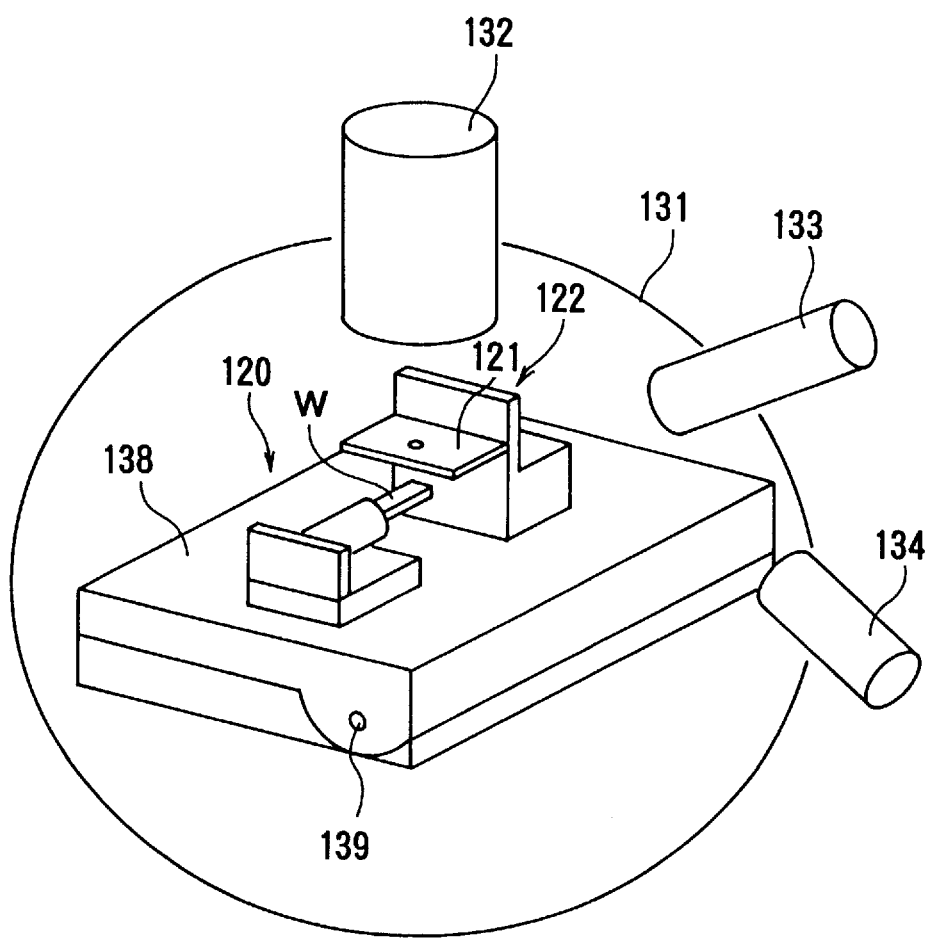
F I G. 11

F I G. 18
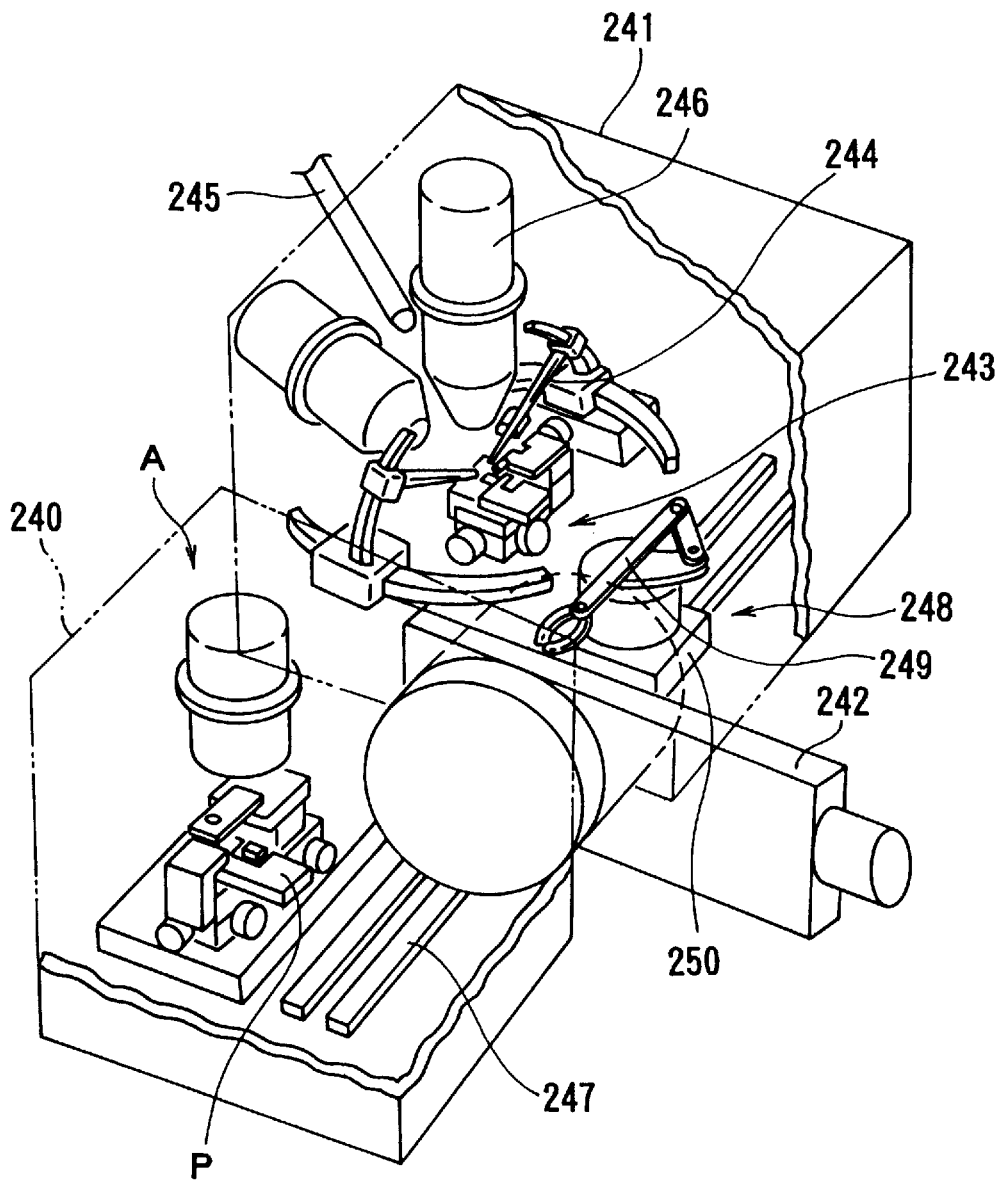

F I G. 22A
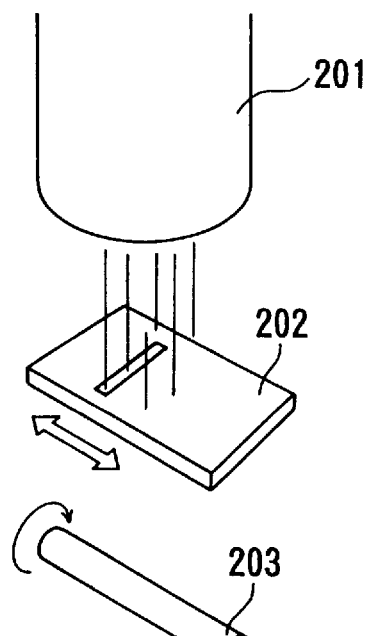
F I G. 22B
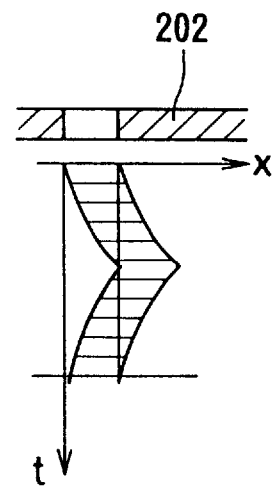
F I G. 23
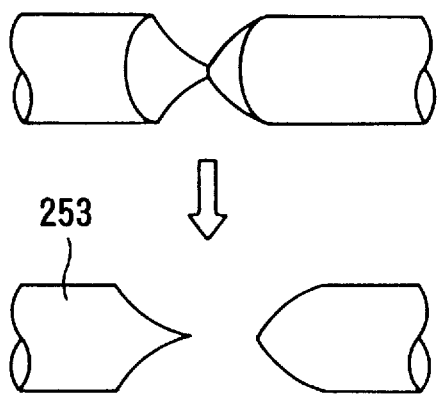

MICRO-PROCESSING APPARATUS AND METHOD THEREFOR

BACKGROUND OF THE INVENTION

1. Field of the Invention

The present invention relates to a micro-working apparatus used to process/assemble semiconductor and optical devices, and a method of using the micro-working apparatus.

2. Description of the Related Art

There has been a growing need for performing accurate and quick micro-processing or assembly operations in a particular atmosphere, to produce advanced devices based on a combination of semiconductor and optical device technologies. Such tasks are performed while utilizing a magnifying means, such as an electron microscope, to observe the behavior of a workpiece.

In a micro-world, a task of processing or assembly while observing the workpiece under magnification at the level of an electron microscope can be a totally different experience than that in a world of macro-objects. In a macro-world of working with regular-sized objects, a task of inserting a rod in a hole, for example, is performed by guiding the rod piece against the inner surface of the hole. In this case, the operator can feel a counter force of resistance exerted by the inner surface, and the insertion process is performed while feeling a constant degree of resistance offered by the hole so that the insertion process can proceed without difficulty. If some abnormality exists in the process, some warning signs, such as abnormal sounds or other signs of problems, are usually generated to alert the operator.

However, in a world of handling microscopic objects, the same task of inserting a fine-rod into a minute hole is a totally different process. In such case, a judgement as to whether or not the fine-rod is being inserted correctly must be made strictly visually. If the operator continues to push the rod into the hole without being aware that the bottom of the rod is somehow stuck on the inner surface, continued pushing results in either snapping of the rod or jumping off of the rod by the accumulated elastic stress in the rod, often resulting in disappearance of the rod. Therefore, it is essential to provide an appropriate observation system for avoiding interference between the hole and the rod. The conventional micro-working methods are not able to offer such system, thus limiting the range of micro-working operations to be those involving only relatively simple tasks.

A remedial step may be to change the location of the observation device to a suitable position to enable more complete observations. However, this process requires focus adjustment each time the location is changed. Further, after focusing the beam to a required location, it is still necessary to remove spot-aberration which is a time consuming operation. Therefore, it is not realistic to expect to perform micro-working tasks that require frequent changes of focus.

On the other hand, there is a technique of liquid crystal optics providing three-dimensional imaging. However, this technique is tiring to the operator, and is not suitable for tasks that require a long duration. Also, when the angle of acuity is large in spatial imaging, although the image may be distinct, the image shape is different from the natural image of the workpiece, and the operator experiences a severe mental stress in performance of the job, leading to possible occupational health problems. Also, although a spatial image includes three-dimensional information to be interpreted by the visual sense of the operator, to be truly useful, it should be accompanied by additional views such as top and side views or views from opposite ends, which should be displayed simultaneously. Conventional micro-working technology is not able to offer such an observation capability.

Furthermore, a normal operation includes a task that is more than simple passive information gathering, such as to draw an accurate circle or draw a straight line. To produce quantitative results for such a task, it is necessary to have an undistorted image of the workpiece viewed from a top true center or from a precise lateral side of the workpiece. On the other hand, to observe the progress during processing and to anticipate the next step for a workpiece which is constantly undergoing changes, feedback control in real-time is essential. In such case, the observation must be carried out from the most advantageous position, which is often a perspective view. In some case, in addition to a view from the dead top, views from other angular positions may also be needed.

In carrying out micro-fabrication, it is desirable that an operation be performed while observing a workpiece under an electron microscope or other observation device. However, there are many practical impediments to arranging the processing apparatus and an observation apparatus in the same working space, because of problems such as the lack of proper space for equipment, and space for movement and contamination of the observation devices by processed particles or secondary emission particles. A fabrication operation is usually performed in a vacuum. Therefore to judge the progress of processing, it is necessary to remove the workpiece from the evacuated environment, observe the results and return the workpiece to the vacuum environment, thus requiring that the apparatus be evacuated each time an observation is made.

Furthermore, when micro-fabricating fine-structures on multiple faces of a workpiece, it is necessary to reposition the workpiece for each fabrication of a fine-structure, resulting in time-consuming and inefficient fabrication. In particular, when it is necessary to produce a fine curvature-structure having rotational symmetry by rotating a workpiece, an extremely tedious operation is needed to align the two axes of the workpiece and the rotation device. When this type of operation has to be carried out a number of times for each processing step for multiple surfaces, efficiency or operation and precision are drastically reduced. Furthermore, a complex device is required to perform such an alignment task, and to provide such a device for each work station is not only a complex and costly task, but also presents a serious disadvantage of requiring the necessary space for equipment.

SUMMARY OF THE INVENTION

It is an object of the present invention to provide an energy beam assisted micro-working apparatus so that a fabrication process including aligning of a masking device and a workpiece as well as assembly of micro-sized workpieces can be carried out while observing the workpiece in real-time.

Another object of the present invention is to provide a micro-pallet device for handling of the workpiece through a number of work stations related to fabrication and assembly operations.

The first object is achieved in a micro-working apparatus comprising: a working device disposed in a working space surrounding a working area; positioning means for adjusting a relative position of a processing and/or assembly means with respect to a workpieces; and not less than two observation means for providing magnified real-time images of progress of micro-working from not less than two directions of view.

According to such apparatus, at least two observation devices are used to observe the progress of work from at least two viewing directions. The operator is able to perform the task while obtaining visual information from at least two directions. Because the necessary visual information can be supplied simultaneously from more than one direction, micro-working tasks can be carried out much more efficiently and quantitatively, results which have been difficult to obtain by use of a conventional apparatus which supplies only unidirectional visual information. Operator fatigue is also reduced considerably. The apparatus thus enables production of fineparts for use in optical devices and in other advanced fields of technology.

An aspect of the apparatus is that an energy beam is used to produce fabrication the progress of micro-working is observed through at least two observation devices.

Another aspect of the apparatus is that a micro-manipulator is used while observing the progress of micro-working through at least two observation devices.

Still another aspect of the apparatus is that micro-working is performed in a hermetically sealed environment while observing the progress of micro-working through at least two observation devices.

Still another aspect of the apparatus is that the observation devices include optical, laser and electron micro-scopes which can be used to observe the progress of micro-working through at least two observation devices.

Still another aspect of the apparatus is that the observation devices are movable with respect to the workpieces, so as to enable positioning of the observation devices to provide the best suited visual information on an operation under progress.

Still another aspect of the apparatus is that the observation devices are movable in a parallel translational direction so as to follow the progress of linear micro-working.

Still another aspect of the apparatus is that the observation devices are movable along a spherical surface, thereby permitting movement of the observation devices in circular paths around the center of the spherical surface to provide different angles of viewing the progress of micro-working.

Still another aspect of the apparatus is that the apparatus is provided with image processing devices to present images from the observation devices so that quantitative observations can be made to determine the position of the workpiece to enable more precise micro-work to be carried out.

Still another aspect of the apparatus is that the apparatus is provided with a control device to automatically control the relative positions of the workpiece with respect to the beam source or the mask member on the basis of the images received from the image processing devices.

The present invention provides another type of micro-working apparatus comprising: workpiece support means for supporting a workpiece disposed in a vacuum vessel; an energy beam source for irradiating an energy beam towards the vacuum vessel; observation means for observing progress of fabrication of the workpiece; and positioning means for relatively positioning the workpiece support means either in an irradiation position for irradiation of the workpiece with the energy beam or in an observation position for observation of progress of fabrication with the observation means.

According to another aspect of the apparatus, the workpiece can be placed either in the irradiation position or the observation position within a chamber to perform various processing steps so that observation and micro-working may be carried out alternatingly without disturbing the vacuum environment. Especially, when performing micro-processing work using mask members, it is necessary frequently to adjust the relative positions, to switch the mask members, or to confirm the progress of micro-working, and even in such cases, it is possible to continue the work without disturbing the vacuum environment. This approach permits the work to be carried out without once exposing the workpiece to the atmosphere so that a high degree of cleanliness can be maintained, thereby improving product quality by avoiding surface oxidation and contamination. Furthermore, because of the elimination of evacuating and leak testing, efficiency is improved and processing time is shortened.

An aspect of the apparatus is that the positioning device moves the workpiece between the irradiation position and the observation position.

Still another aspect of the apparatus is that the positioning device moves the energy beam source and the observation devices.

Still another aspect of the apparatus is that it the workpiece support means includes a micro-movement adjusting device so that the workpiece can be moved together with the support means to the observation position to adjust positioning or to observe the progress of micro-working.

Still another aspect of the apparatus is that mask member holding means is disposed in a specific location between the energy beam source and the workpiece to mask the workpiece from irradiation, so that fine-patterns of the mask member can be transferred onto the workpiece while controlling the degree of exposure to the energy beam.

Still another aspect of the apparatus is that the holding means comprise micro-movement means for providing micro-positioning of the mask member with respect to the energy beam so as to permit relative movement of the mask member while observing the progress of micro-working in the observation position.

Still another aspect of the apparatus is that a plurality of exchangeable mask members having different fine-patterns are provided, thereby permitting different fine-patterns to be duplicated on one surface or on different surfaces. This arrangement permits a series of masking steps, such as mask member exchange, position adjustment of the mask member with respect to the workpiece, to be carried out precisely and quickly without disturbing the vacuum environment, thereby avoiding oxidation contamination and problems of positioning errors.

Still another aspect of the apparatus is that the observation means include not less than two observation means, each observation means providing a different field of view of working areas on the workpiece, thereby providing a spatial view of the micro-work in progress.

Still another aspect of the apparatus is that the positioning means include a parallel translation device, thereby permitting a reciprocating motion between the observation position and the irradiation position.

Still another aspect of the apparatus is that the positioning means include a rotational movement device, thereby permitting a reciprocating rotational motion between the observation position and the irradiation position.

Still another aspect of the apparatus is that the energy beam is selected from the group consisting of a fast atomic beam, an ion beam, an electron beam, an atomic beam, a molecular beam, a laser beam, a radiation ray beam and an X-ray beam. By using an electrically neutral beam, such as a fast atomic beam, superior directionality of the beam is maintained in any type of material, thereby enabling production of precise fine-structures such as deep channels having precisely vertical walls and flat bottom surfaces.

Ion beams are useful in fabricating electrically conductive materials such as metals. Electron beams can be produced as a fine-beam or a divergent beam, and both types are useful in combination with reactive gases to activate the surface to be processed of the workpiece under highly controllable conditions. Laser, X-ray and radiation ray beams provide different energies and wavelengths and offer different degrees of surface reactivity. For micro-processing operations, these beams can be used directly to remove surface materials, or can be used in conjunction with reactive gases to provide chemical surface activation. These beams can be selected as needed, depending on the size of the fine-structure to be produced and the reactivity of the surface material. When the size of the ultra-fine structures becomes smaller than the wavelength of a laser beam, for example, fabrication becomes usually very difficult, and therefore, X-ray or radiation beams are more suitable. Atomic or molecular beams are low energy beams, and are useful in avoiding the generation of surface damage. In summary, the choice of an energy beam should be based on the need of each particular application.

Still another aspect of the apparatus is that the observation means include a single observation means or a combination of observation means selected from the group consisting of an optical microscope, a laser microscope and an electron microscope, thereby offering a wide choice of observation methods. The optical method is simple, the laser method offers a high coherency of beam energy over a long working distance, and the scanning secondary electron microscope provides a higher magnification capability.

Another object of the present invention is to provide micro-pallet means for holding a workpiece and positioning the workpiece with respect to micro-working means, comprising a pallet body and a holding section freely rotatably disposed on a shaft member fixed on the pallet body. This pallet arrangement permits the workpiece to be disposed on the holding section and transported so that in-situ micro-working can be performed quite readily. This approach is particularly effective when a series of process operations are to be performed on the work-piece serially by rotation of the workpiece. There is no need to reposition the workpiece, thus increasing precision and operational efficiency. Further, there is no need to provide a positioning device for each station, thus leading to a compact and simplified overall construction of the apparatus, thereby lowering the cost of manufacturing the apparatus.

An aspect of the pallet means is that the shaft member is provided with power transmission means for freely coupling or decoupling the shaft member with an external driving source.

Another aspect of the pallet means is that the shaft member has a transmission mechanism which can be coupled or decoupled to an external driving device, thereby eliminating the need for having a driving device on the pallet means, providing a compact and light-weight transporting device, and lowering the cost of the overall apparatus.

Another aspect of the pallet means is that the power transmission means include pulleys and belts, gears and friction rollers all of which are simple and effective methods of power transmission.

Another aspect of the pallet means is that the shaft member is provided with pre-stressed bearings for limiting wobble of the shaft member to not more than 10 $\mu$m. The bearings may be angular ball bearings or deep channel ball bearings. Pre-stressing minimizes slack between moving and stationary races of the bearing, thereby limiting wobble to less than 10 $\mu$m to produce fine-structures with high precision or to perform micro-assembly operations.

Another aspect of the pallet means is that the holding section is provided with a centering device for aligning a rotational center of the shaft member with a rotational center of the workpiece by rotational and parallel translational movements, thereby eliminating shaft wobbling.

Another apparatus for performing micro-working comprises: a work station for performing micro-working; and micro-pallet means for transporting and positioning a workpiece in the work station for performing micro-working; wherein the micro-pallet means is provided with a holding section freely rotatably disposed on a shaft member fixed to a pallet body. Accordingly, a workpiece is held by the holding section disposed on the shaft member of the pallet body, and is transported and positioned to be rotated for processing or assembly in the micro-working apparatus.

Another aspect of the apparatus is that the work station is provided with driving means for driving the shaft member, and the pallet body is provided with power transmission means for freely coupling or decoupling the driving means to or from an external driving source. In this arrangement, the shaft member can be rotated by means of the external driving device, as required, so that the micro-pallet need not be equipped with a driving device.

Another aspect of the apparatus is that pulleys and belts are used to transmit driving power to the micro-pallet. The workpiece support shaft and the drive shaft are moved into position to couple with each other by winding the belt to the shafts to transmit driving power from the drive shaft to the workpiece support shaft.

Another aspect of the apparatus is that gears are used to transmit the driving power to the micro-pallet. The workpiece support shaft and the drive shaft are moved into position so that the gears are coupled with each other to transmit the driving power from the drive shaft to the workpiece support shaft.

Another aspect of the apparatus is that friction rollers are used to transmit the driving power to the micro-pallet. The workpiece support shaft and the drive shaft can be driven by the contact of the rollers themselves or by the contact of rollers with other transmission devices to transmit the driving power from the drive shaft to the workpiece support shaft. It is preferable that one of the rollers be elastic or that the contact is made elastically. For example, rollers may be driven by friction, or a combination of a roller and a belt may be used to transmit the driving power.

Another aspect of the apparatus is that the shaft member is provided with pre-stressed bearings for limiting a wobble of the shaft member to not more than 10 $\mu$m by applying pre-stressing and minimizing slack between moving and stationary races of the bearing, thereby limiting the wobble to less than 10 $\mu$m to produce high precision processing or assembling.

Another aspect of the apparatus is that the holding section is provided with a centering device for aligning a rotational center of the shaft member with a rotational center of the workpiece by rotational and parallel translational movements, so as to minimize shaft wobble and produce high precision products.

Another aspect of the apparatus is that the workpieces are processed using an energy beam and a mask member for controlling the exposure of the workpiece to the energy beam so that the workpiece is exposed to a controlled degree of exposure to irradiation in accordance with the requirements of the fine pattern provided on the mask member.

Another aspect of the apparatus is that the micro-pallet means are transported by robotic means, which should be provided with suitable driving devices, a table for disposing the workpieces and arms for handling of workpieces.

Another aspect of the apparatus is that micro-working is performed in a vacuum environment, thereby enabling performance of micro-working operations without adverse effects of the ambient environment.

Another aspect of the apparatus is that a plurality of work stations are communicated by means of hermetic valves, thereby enabling performance of various micro-working operations without being affected by the environment present in other working areas.

BRIEF DESCRIPTION OF THE DRAWINGS

FIG. 1 is a perspective view of an embodiment of an apparatus for performing a micro-working operation.

FIG. 2 is a perspective view of another embodiment for performing a micro-working operation.

FIG. 4A is a perspective view; FIG. 4B and 4C are illustrations of enlarged images; and FIG. 4D is an illustration of a geometric relationship of the related sections.

FIG. 5 is a perspective view of still another embodiment of the method for performing a micro-working operation.

FIG. 7 is a perspective view of the processing apparatus shown in FIG. 6 for performing a micro-working operation.

FIG. 11 is a perspective view of still another embodiment of a processing apparatus.

FIG. 18 is a perspective view of still another embodiment of a micro-working apparatus.

FIGS. 22A–22B show another example of steps using such processing apparatus.

FIG. 23 shows a step of making a fine-structure by the steps shown in FIGS. 22A–22B.

DESCRIPTION OF THE PREFERRED EMBODIMENTS

Figure 3A:
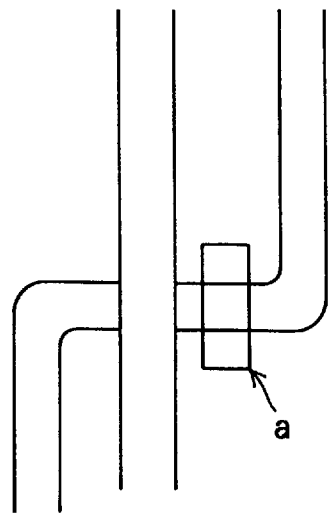
FIGS. 3A–3B are perspective views of still another embodiment for performing a micro-working operation.

In the following, preferred embodiments will be explained with reference to the drawings.

FIG. 1 is a perspective view of an embodiment of the micro-working apparatus of the present invention, and is suitable for performing micro-working, i.e. processing and/or assembly operations, on workpieces (minimum size on the order of several hundred microns).

The apparatus comprises: a work pedestal 1 disposed in a central working area A, a pair of assemblers 2, 3 disposed in a first working space surrounding the work pedestal 1, and a pair of magnifying observation devices (scanning secondary electron microscopes) 4, 5 disposed in a second working space surrounding the first working space.

The pedestal 1 is disposed in the center of the apparatus base 6 and is provided with an XYZ-stage for producing movements in the horizontal and vertical planes. A pair of opposing semi-circular rails 7, 8 (first rails) are provided to surround the pedestal 1, and these rails are provided with sliders 9, 10 mounted slidably on the respective rails. The sliders 9, 10 are provided with arc-shaped support columns 11, 12, respectively, which are provided with respective sliders 13, 14. Each of the sliders 13, 14 is provided with a respective assembler 2, 3, e.g. micro-manipulators for performing assembly operations.

Another embodiment of the apparatus could include an energy beam source on one slider 13 and a manipulator 3 on the other slider 14. When such an apparatus is to be used for an energy beam-assisted processing operation, the manipulator 3 is used as a device for holding a mask member having specific fine-patterns for transmission therethrough of the energy beam. Also, in the above example, both observation devices 4, 5 are electron microscopes, but it is permissible to use optical or laser microscopes or a combination of optical, laser and other applicable magnifying devices, depending on the application. It is not necessary to limit the number of observation devices to two, but three or more devices can be employed.

Further outwards of the first rails 7, 8, on the apparatus base 6, are disposed second rails 15, 16 concentrically with the first rails 7, 8. Rails 15, 16 are provided with freely slidable sliders 17 and 18, respectively, having respective arc-shaped columns 19, 20 of certain lengths erected thereon, as well as respective sliders 21, 22. Electron microscopes 4, 5 are disposed on the sliders 21, 22 to provide a field of view including the working area A. One of the columns 19, 20 extends to the top region of the working area A so as to permit observation of the working area A from the top true center thereof.

Each of the sliders 9, 10, 13, 14, 17, 18, 21 and 22 may include driving devices such as motors so as to enable movement of the sliders by remote control to specific locations.

FIG. 1 illustrates an example of a micro-working operation involving a first workpiece W1, in the form of a fine rod, to be inserted into a hole 23 provided in a second work-piece W2. The fine work rod piece W1 is held by manipulator 3 and is inserted into the hole 23 while going through positional alignment by rotational and parallel movements. In performing such operation, the operator observes the movements of the work-pieces on screens of both observations devices (electron microscopes in this case) 4, 5 as well as through unaided visual observation, and operates the driving devices so as to move the sliders 9, 10, 13, 14, 17, 18, 21 and 22 along the rails 7, 8, 15 and 16 and columns 11, 12, 19 and 20. By such a process, the observation devices 4, 5 are made to move along spherical surfaces in relation to the workpieces W1, W2 to obtain image data seen in directions necessary to properly perform the operation.

According to this method, observation of workpieces can be made simultaneously from the top true center or at a precise lateral position so as to enable detailed observation of the positional relationships in the working area, embodied by the fine-rod piece W1 and the hole 23. Observation can be made from as many different directions as necessary for the performance of the particular task, and serves to provide an invaluable aid in performing the task correctly.

FIG. 2 shows a view of a working area close to the working area A in an example of processing operation using an energy beam. A mask M, acting as a mask member, is placed on a substrate workpiece W3, and an energy beam, such as fast atomic beam (FAB) is irradiated from above. The operational steps for transferring the pattern on the mask M onto the workpiece W3 may involve moving the mask M to control the amount of surface material removed by controlling the duration of exposure to FAB irradiation. The necessary movement is a parallel movement of the mask M with a separation distance of about 100 μm, for example, between the mask member and the surface to be processed on the workpiece W3.

In this case, the mask M is disposed on a rotation stage 25 and workpiece W3 is provided on an XY-stage 24 disposed in the working area. One observation device 5 of the two observation devices is lowered to an approximately level position. The mask M and the workpiece W3 is aligned horizontally by means of the observation device 4 in a top direction, and the parallel alignment and the separation distance are measured by means of the observation device 5 in a horizontal direction. If it is necessary to tilt the mask M to align the mask M parallel to the workpiece W3, the positional alignment between the two is lost and additional adjustment is necessary. However, in the method of the present invention, observations are being made through two observation devices 4, 5 simultaneously, and therefore, there is no need to repeat adjusting the focus of one observation device many times so as to obtain proper alignment adjustments.

Figure 3B:
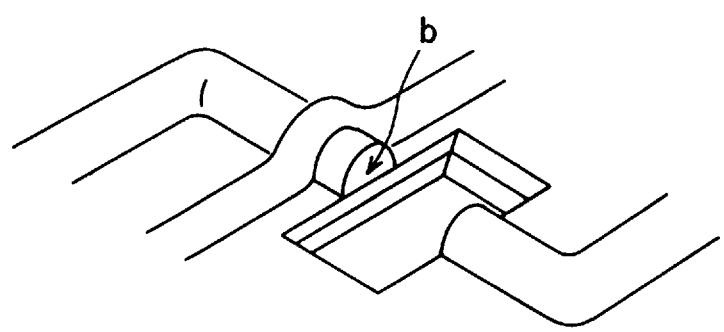

FIGS. 3A, 3B show an example of repairing a line connection in a large-scale integrated (LSI) circuit. In this repair operation, it is required to sever a section "a" with a focused ion beam. From a top view observation only as in FIG. 3A, it is not possible to judge when the line is completely severed. By positioning the observation device 5 at an oblique angle as shown in FIG. 1, it is possible to confirm that the line has been severed, by enabling observation of the severed surface "b" at an angle as shown in FIG. 3B. In performing such an operation, it sometimes occurs by some external disturbance that the processing regions become shifted from a target region. Therefore, to prevent such an occurrence, it is necessary to simultaneously observe from the top view with the observation device 4.

Figure 4A:
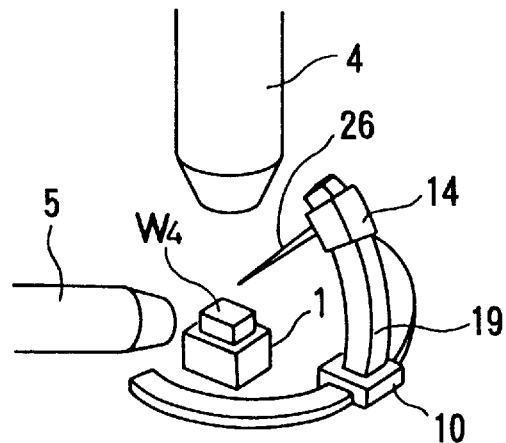
FIG. 4A–4D are illustrations of still another embodiment for performing a micro-working operation: where
Figure 4B:
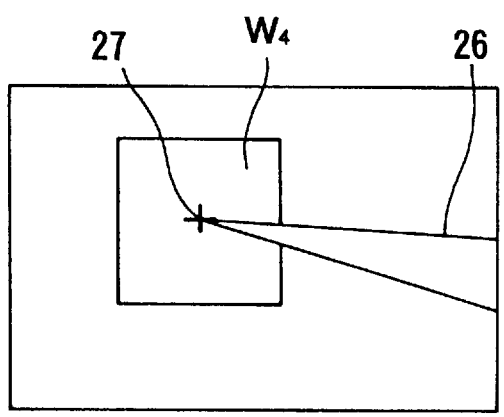
Figure 4C:
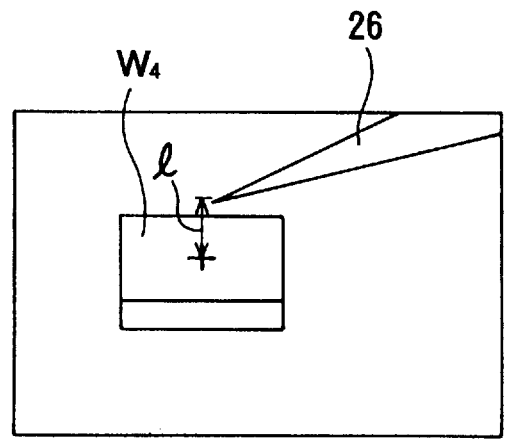
Figure 4D:
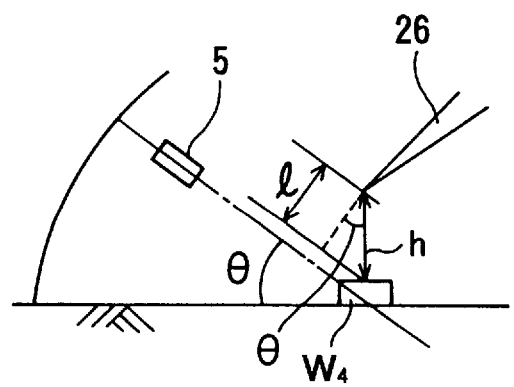

FIGS. 4A–4D illustrate an operation to move a needle tipped tool 26 attached to slider 14 to a mark 27 placed on a workpiece W4 while observing the motions through two observation devices (scanning secondary electron microscopes) 4, 5. First, as shown in FIG. 4A, by observing the image from the first device 4 disposed on the top, the tip of the tool 26 and the mark 27 are aligned, as illustrated in FIG. 4B. Based on the image shown on the second device 5, the distance between the tip of the tool 26 and the mark 27 is measured as "1", as indicated in FIG. 4C. From the geometry shown in FIG. 4D, the actual distance "h" between the tip of the tool 26 and the mark 27 is given by the following expression:

h=1/cos ⊖, and it thus follows that the tip of the tool 26 is made to contact the mark-27 by moving the Z-stage by an amount equal to "h". To illustrate such operation, the mark 27 was drawn on the work-piece W4, but in an actual operation, software programming can be used to compute the marking location in the same manner without actually marking the surface.

FIG. 5 illustrates a process of installing a baby-chip 29 having a custom LSI circuit on a general purpose mother-chip 28. Such a baby-chip 29 is utilized in cases when the production method for the baby chip 29 can be customized or when the production method is different from that for the mother-chip 28 or when the yield for the baby-chip is low. The method involves a first step of local planarizing of the installation region with a diamond needle, positioning of the baby-chip 29 in the installation region and local film deposition to provide a line connection 30. Subsequent inspection is performed by the use of probe tips 33, 34 attached to the ends of tools 31, 32 which are mounted on sliders 13, 14. If the installation process is improper, the connection is severed by etching with a focused ion beam (FIB), and the connection steps are repeated.

Figure 6:
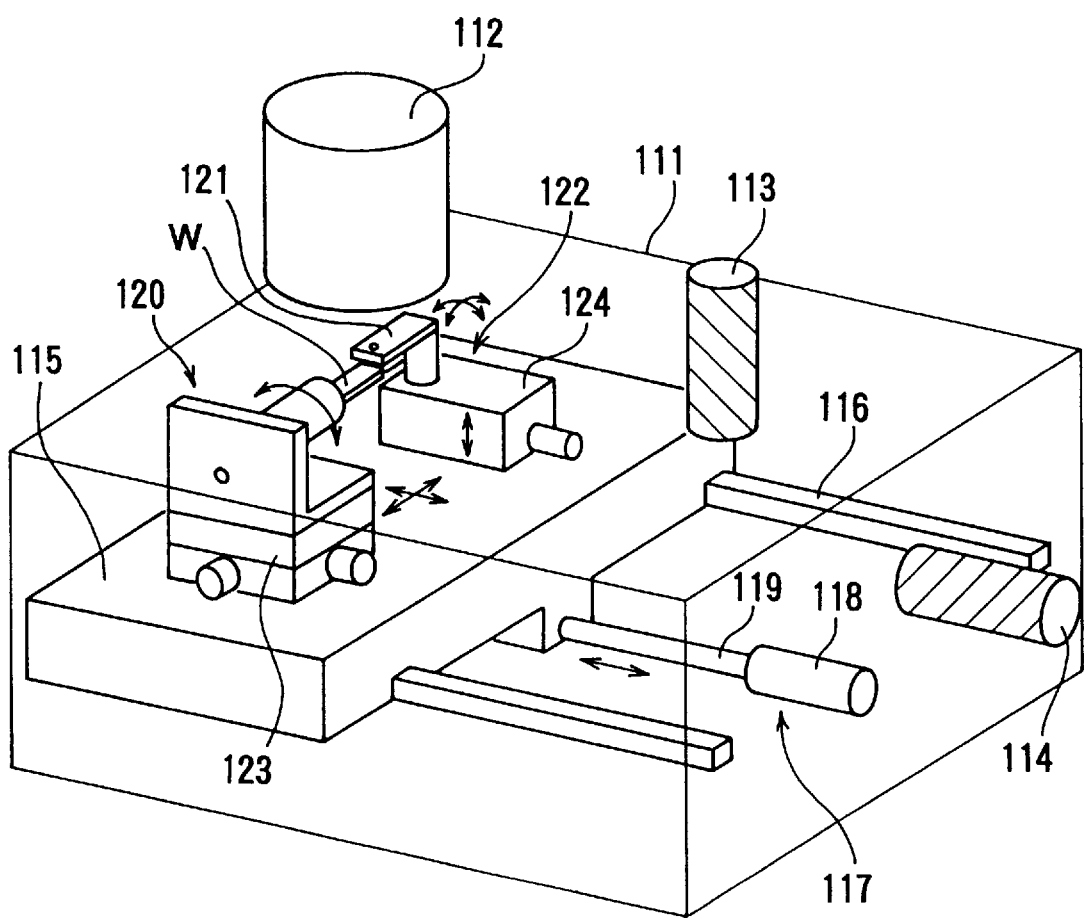
FIG. 6 is a perspective view of an embodiment of a processing apparatus for performing a micro-working operation.

FIG. 6 is a schematic illustration of an embodiment of a micro-working apparatus of the present invention. An outline of a processing chamber 111 is shown by solid lines, and the processing chamber 111 comprises a hermetically sealed space which is maintained at either a vacuum atmosphere or a low pressure inert atmosphere. An energy beam source 112 is disposed at an upper portion of one end of the processing chamber 111. A downward-viewing optical microscope 113 is disposed on an upper portion of the other end of the chamber 111, while a horizontal-viewing optical microscope 114 is disposed on a side surface at the other end of the chamber 111.

Inside the chamber 111, there is a pedestal 115 freely slidably mounted on a pair of rails 116 disposed parallel to one wall of the chamber 111. Below the center of the pedestal 115, there is a driving device 117 which moves the pedestal 115 along the rails 116, thereby producing a reciprocating motion of the pedestal 115 between an irradiation position below the energy beam source 112 and an observation position viewed by the optical microscope 113. In the illustration, the driving device 117 comprises a screw shaft 119 driven by a motor 118 to provide precise positioning at the irradiation position and the observation position. There is no particular restriction to the construction of the driving device, and so long as precise positioning is achievable, it is permissible to use piezo-electric elements in combination with a linear motor, for example.

The pedestal 115 is provided with a specimen holding stage 120 for holding a workpiece W and an opposing mask member holding device 122 for holding a mask 121. These holding devices 120, 122 are provided with positioning devices 123, 124 to position the workpiece W or the mask 121 and are equipped with actuators for producing rotational or parallel translation movement in the X, Y or Z directions.

The operation of this apparatus is as follows. The pedestal 115 is moved to the observation position, where the mask 121 and the workpiece W are aligned by operating the positioning devices 123, 124 while observing such motions under the optical microscopes 113, 114. The pedestal 115 is then moved to the irradiation position below the energy beam source 112 to perform a processing operation. When it is necessary to observe the progress of processing or to perform adjustments in positioning, the driving device 117 is used to move the pedestal 115 to the observation position to observe the state of the workpiece w under the microscopes 113, 114. Subsequently, the pedestal 115 is returned to the irradiation position to continue the processing operation.

As described above, because the micro-working apparatus is provided with two observation devices 113, 114, it is possible not only to observe the position and the shape of the workpiece in a three-dimensional space but also to finely adjust the relative parallel positioning of the workpiece with resect to the mask. When fabricating a pattern of the mask 121 on the workpiece W by using mask 121 in combination with a highly linear energy beam, such as an FAB, the correct position of the mask 121 to the workpiece can be determined readily, and positioning can be adjusted quickly and precisely. In this case, if the pattern dimensions are of the order of several tens of micrometers, optical microscopes 113, 114 having a magnification higher than ×500 would be quite adequate for the task.

In this apparatus, because the irradiation position and the observation position are provided separately, there is less of a problem of particles emitted by the etching process directly affecting the performance of the observation devices. In this case, a curtain to separate the space may be provided to further reduce the influence of such an effect when the pedestal 115 is in the irradiation position.

FIG. 7 shows a portion of the micro-working apparatus of FIG. 6 but comprising a plurality of masks 121 on a mask holding device 121a so that different patterns can be processed on the workpiece W by exchanging the masks 121 during the irradiation step.

In this case, by pre-positioning the masks 121 with respect to the workpiece W before commencing the irradiation step, it is only necessary to rotate the mask holder 121a to change the mask during the irradiation step. Thus there is no need to reposition the masks. It is of course permissible to return to the observation position to readjust the relative positioning of the masks 121 with respect to the workpiece W.

Figure 8:
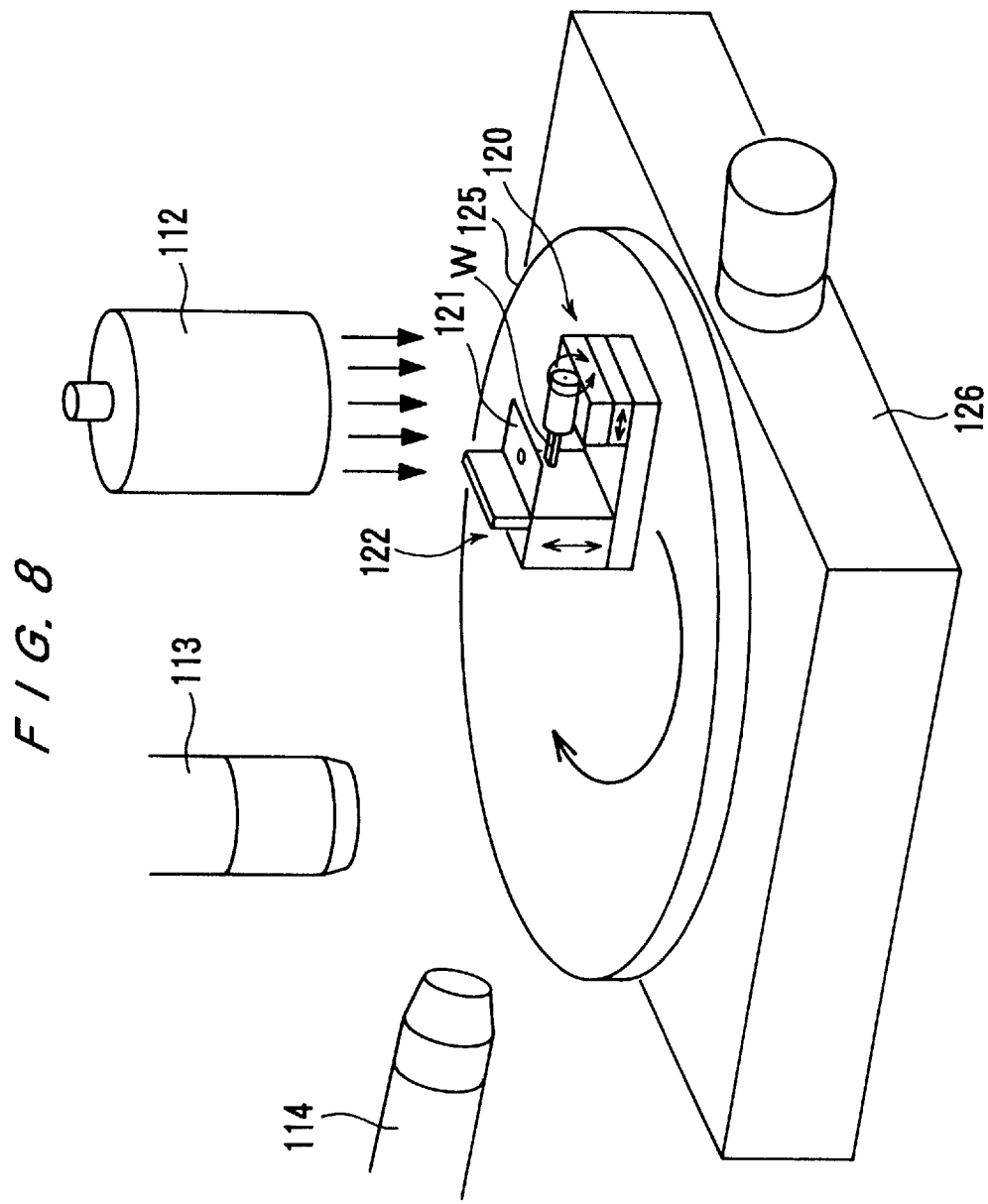
FIG. 8 is a perspective view of still another embodiment of a processing apparatus.

FIG. 8 shows another embodiment of the micro-working apparatus having a turntable base 125 which is driven by a rotation device 126 disposed below the turntable base 125 to rotate the turntable base 125 about a central vertical axis. The workpiece W and the mask 121 are freely movably held in place by their respective holding devices 120, 122. In this embodiment, the irradiation position and the observation position are separated so that the workpiece W and the mask 121 can be interchanged by rotation of the turntable base 125 through 180°.

This apparatus also permits instant judgement to be made, while leaving the workpiece W in the vacuum, whether to continue processing or exchange masks 121 by observing the progress of the operation so that the process may proceed smoothly without being interrupted.

Figure 9:
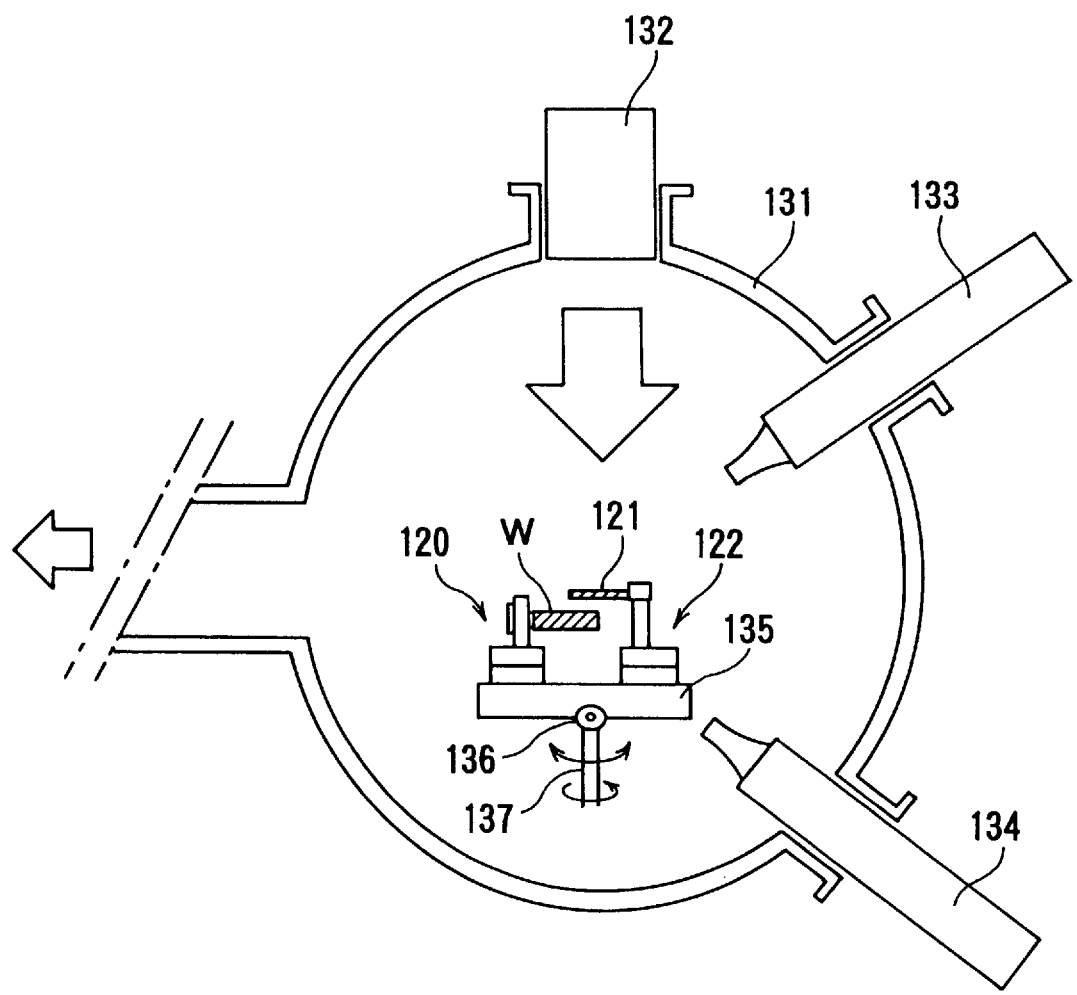
FIG. 9 is a cross sectional view of still another embodiment of a processing apparatus.

The embodiment of the micro-working apparatus shown in FIG. 9 includes a spherical processing chamber 131 having a workpiece W disposed at about the center thereof.

Energy beam source 132 is disposed directly above, and each of two optical microscopes 133, 134 is placed, respectively, at an angle of about 45° from the top and the bottom to view the center region of the chamber 131. Pedestal 135 is provided with a drive mechanism (not shown) to rotate about a horizontal axis 136 and a vertical axis 137 so that the holding devices 120, 122 for holding workpiece W and the mask 121 can tilt or rotate about and in a horizontal plane. Fabrication is performed by positioning the mask 121 and the workpiece W in a processing position directly below the energy beam source 132, and observations are made by tilting the pedestal 135 so that the mask 121 and the workpiece W will be in the field of view of the optical microscopes 133, 134.

By rotating the pedestal 135, observations regarding the positional alignment between the workpiece W and the mask 121 as well as the progress of micro-working on the surface to be processed of the workpiece W may be made both during fabrication as well as after fabrication by means of the optical microscopes 133, 134.

The advantage of this configuration is that the distance of movement is short, and the observation position and processing position can be accessed quickly by rotation or tilting of the pedestal 135 about the axes 136, 137, compared with movement requiring parallel translation and rotation motions.

Figure 10A:
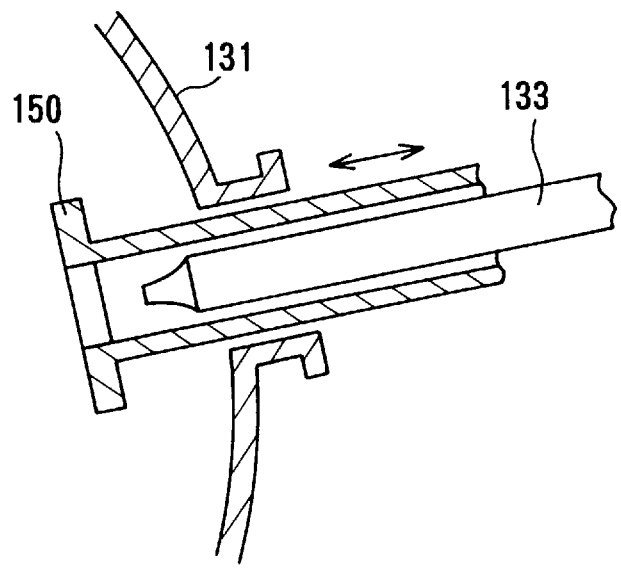
FIGS. 10A–10B are cross sectional views of the processing apparatus shown in FIG. 9.
Figure 10B:
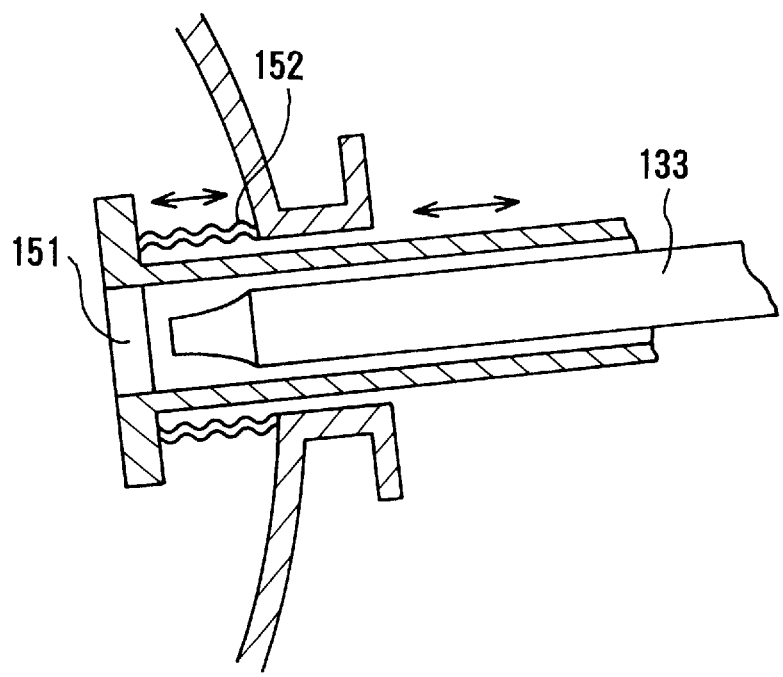

The observation devices in the apparatus shown in FIG. 9 are susceptible to the effects of debris produced during processing, because of the short distances between the processing position and the observation position. When using a corrosive gas or reactive gas in the processing chamber, contamination of the detectors and the beam sources of the electron microscopes or the lenses of the optical microscopes can be prevented by using a masking arrangement shown in FIGS. 10A, 10B. The masking device shown in FIG. 10A comprises a shutter 150 or a valve, disposed at the leading end of the optical microscopes 133, 134, and which is displaced during observations. Instead of the shutter 150, the masking device shown in FIG. 10B comprises a bellows 152 having a glass window 151 so that hermetically sealed spaces may accommodate the optical microscopes 133, 134.

Figure 12:
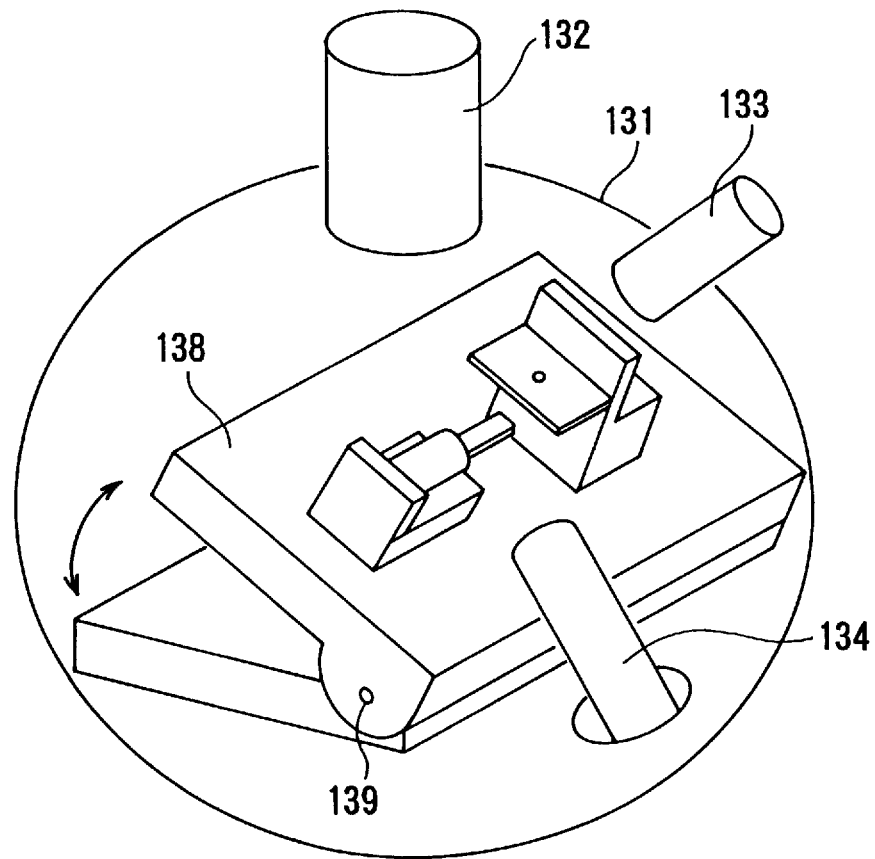
FIG. 12 is a perspective view showing the operation of the processing apparatus shown in FIG. 11 for performing a processing operation.
Figure 13:
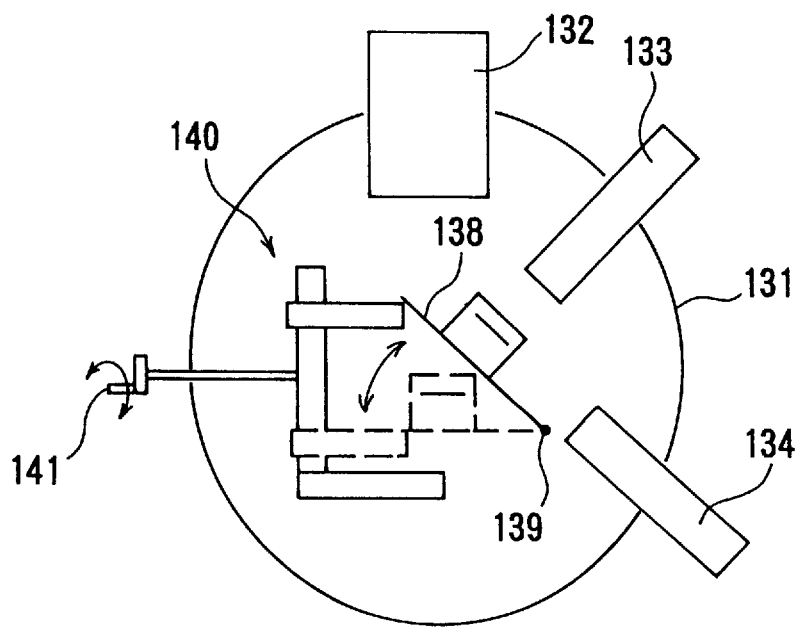
FIG. 13 is a cross sectional side view of the processing apparatus shown in FIG. 11.

FIGS. 11–13 show the apparatus shown in FIG. 9 having spherical processing chamber 131, energy beam source 132 and observation devices 133, 134 with the difference that the base table 138 is rotatable about a horizontal axis 139. The horizontal axis 139 is disposed so that it is perpendicular to the plane containing the axes of the energy beam source 132 and the observation devices 133, 134. When the table base 138 is rotated about the axis 139, the workpiece W and the mask 121 are successively brought into particular positions. Changes of orientation angles are made externally to the processing chamber 131, by turning a handle 141 provided on a link mechanism 140 disposed opposite to the rotation axis 139.

Figure 14:
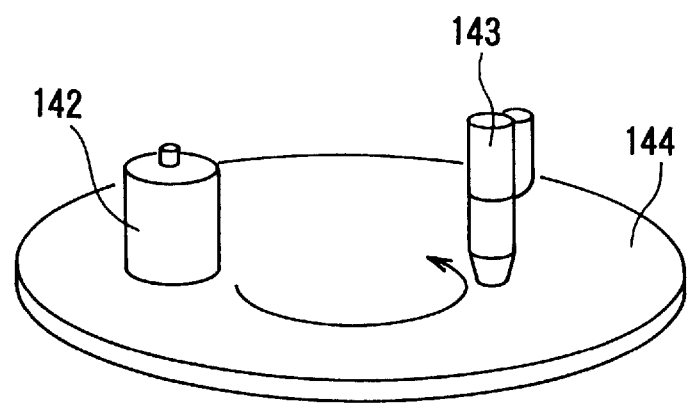
FIG. 14 is an illustration of the operation of another embodiment of the processing apparatus.
Figure 14:
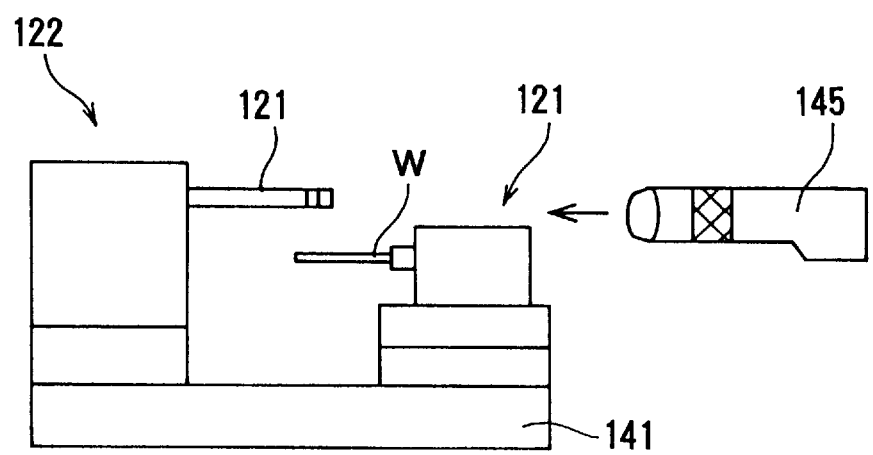

FIG. 14 shows a stationary base 141a, having the holding devices 120, 122 for the mask 121 and the workpiece W, rotation plate 144 provided with an energy beam source 142 and a top observation device 143. In this configuration, the top observation device 143 rotates but the other observation device 145 is a stationary side viewer device and only permits observation of the mask 121 and the workpiece W from the lateral side of the apparatus. The driving and supporting mechanisms for the rotation plate 144 are hermetically sealed in the processing chamber using magnetic fluid seals or O-ring seals.

Figure 15:
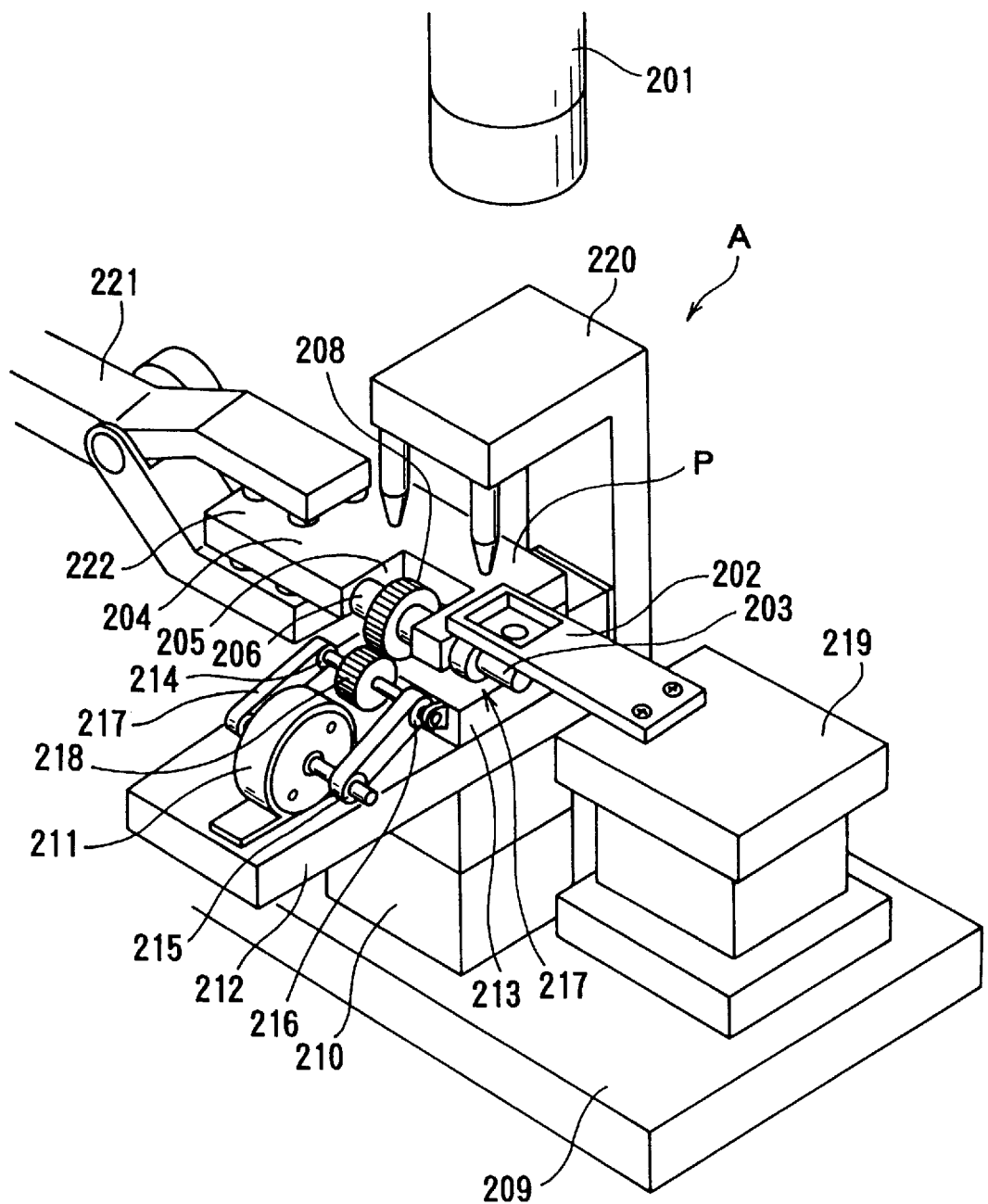
FIG. 15 is a perspective view of still another embodiment of the processing apparatus.

FIG. 15 shows an embodiment of a micro-pallet device (shortened to micro-pallet or pallet hereinbelow) of the present invention to be used in micro-processing operations using an energy beam. The micro-processing apparatus A comprises an energy beam source 201 providing an energy beam to irradiate a workpiece 203 through a mask 202 disposed in the beam path to control the exposure to the beam energy.

The micro-pallet P has a cutout section 205 in pallet body 204 and a shaft member 206 spanning across the space of the cutout section 205 and supported by bearings (not shown). The shaft member 206 protrudes out of the side surface of the pallet body 204 and is provided, at its tip, with a holding section 207 for holding a workpiece 203. The shaft member 206 has a driven gear 208 in the cutout section 205 for transmitting a rotational drive force to the workpiece 203. For the bearings, angular ball bearings and deep groove ball bearings are used to provide pre-stressing between rotary and stationary rings to eliminate the spacing between inner and outer rings to limit wobble of the shaft member 206 to less than 10 $\mu$m.

Above base 209 of the apparatus A, an XY-stage 210, disposed opposite to the energy beam source 201, is used to support a motor base 212 for mounting an electrical drive motor (rotational drive device) 211 as well as a pallet base 213. The drive motor 211 drives a transmission gear 218 through a transmission shaft 214, pulleys 215, 216 and a belt 217 provided on a side surface of the pallet base 213. A portion of the transmission gear 218 protrudes above the surface of the pallet base 213 and by moving the pallet P placed on the pallet base 213 horizontally, the gear 218 can be engaged with the driven gear 208.

The apparatus A further comprises: a mask holding device (Z-stage) 219 for holding mask 202 between the energy beam source 201 and the workpiece 203, and a pallet-pressing device 220 having an L-shaped cross section. Both of the devices 219, 220 are freely vertically movable.

The section opposite to the cutout section 205 on the pallet body 204 is provided with a flat section 222 for coupling to an arm 221 of a robot, for example.

Figure 16:
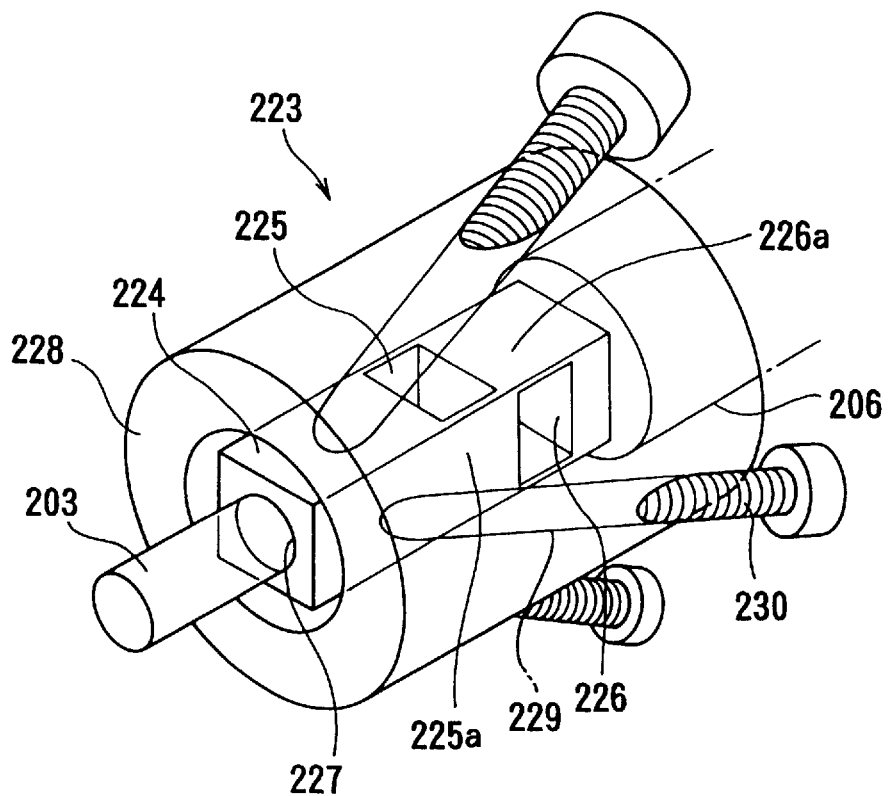
FIG. 16 is a perspective enlarged view of essential parts of the embodiment shown in FIG. 15.
Figure 17:
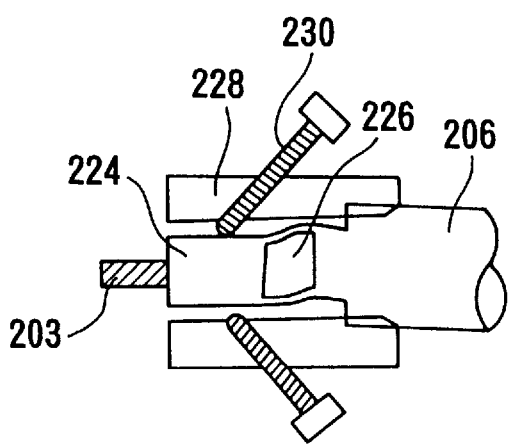
FIG. 17 is a schematic view of a cross section of the device shown in FIG. 16.

FIGS. 16, 17 show details of the holding section 207 having a micro-positioning device 223, disposed at the tip of the shaft member 206, which is used to align the centers of the shaft member 206 and the workpiece 203. The micro-positioning device 223, shown in FIG. 16, includes a tip section 224 of an elastic hinge structure which is capable of providing mutually orthogonal micro-movements in a plane perpendicular to the axis of the shaft member 206. The tip section 224 is of square cross sectional shape and is provided near its base region with two square holes 225, 226 oriented in two perpendicular directions, thus forming two pairs of opposing parallel sections 225a, 226a. The end of the tip section 224 has an opening 227 for receiving an optical fiber 203 (micro-sized workpiece) and is surrounded with a cylindrical outer ring 228 fixed to the shaft member 206. The outer ring 228 has M2 female threads 229, in each quadrant at an angle of 30° to the shaft axis as shown in FIG. 17, into which is fitted an M2 precision male bolt 230.

Figure 19:
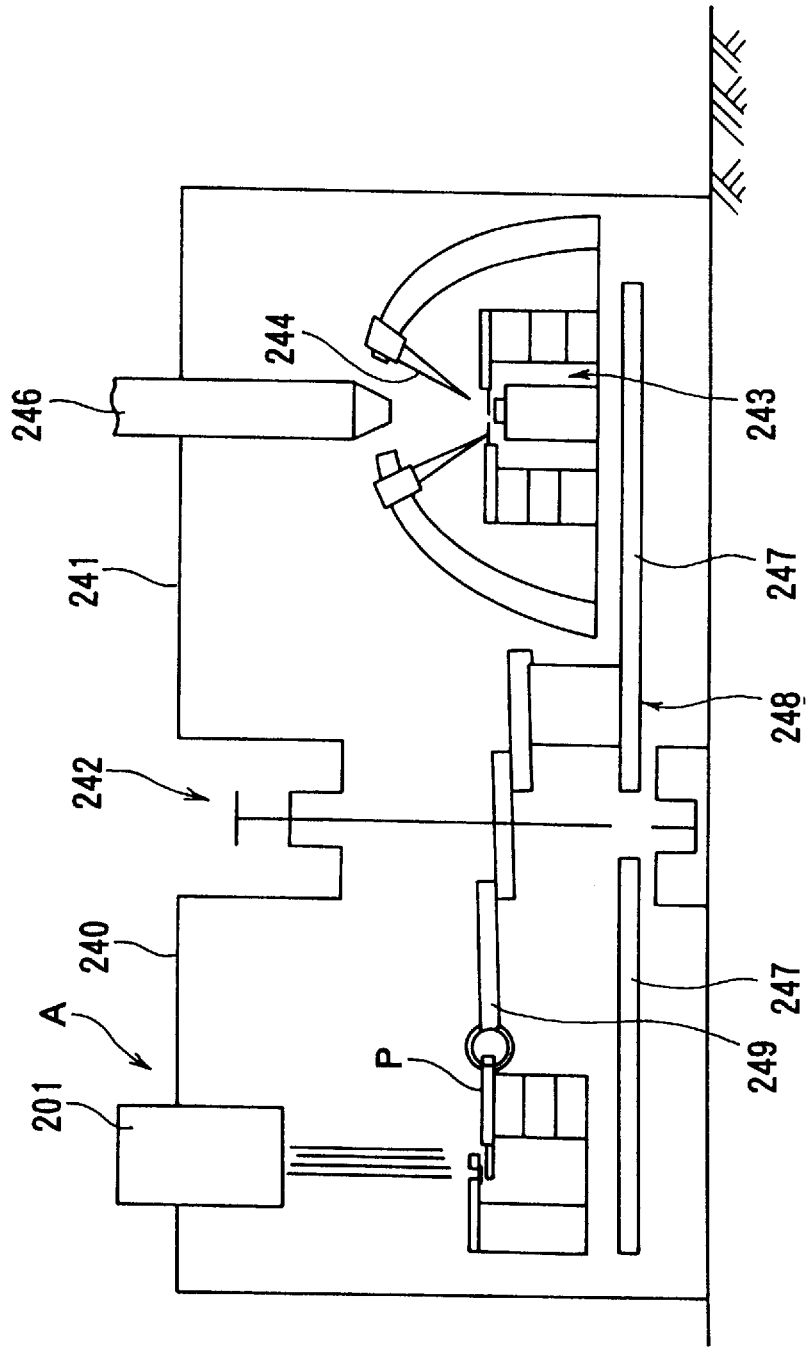
FIG. 19 is a schematic illustration of a cross section of the apparatus shown in FIG. 18.

FIGS. 18 and 19 show an overall view and a side view of the micro-working apparatus provided with a processing chamber 240 having the processing apparatus A presented earlier, and an assembly chamber 241 designed primarily for assembling of fine-parts. The two chambers 240, 241 are hermetically sealed and are connected to each other through a gate valve (hermetic valve) 242, as shown in a side view of the apparatus A illustrated in FIG. 19. The assembly chamber 241 has a central assembly stage 243, surrounding manipulators 244, an energy beam source 245, and observation devices 246.

The processing chamber 240 and the assembly chamber 241 are connected with rails 247 for transporting a transport robot 248 carrying a micro-pallet P. The transport robot 248 is provided with four arms 249 having four rotation links, and the length of its body section 250 is longer than the distance of a separation between the rails caused by the presence of the gate valve 242, thus enabling the robot 248 to cross over the separation. The workpiece 203 is thus able to move freely between the two hermetically sealed chambers 240, 241 by being mounted on the micro-pallet P and transported by the robot 248, to be manufactured into a complex shaped part.

Next, a case of fabricating an optical fiber using such micro-working apparatus will be discussed.

First, an optical fiber 203 is fixed with a suitable jig into a hole 227 of the holding section 207 of the shaft member 206 of the micro-pallet P. Using the arms 249 of the robot 248, the micro-pallet P is transported to the pallet base 213, and is positioned in place by means of the XY-stage 210. The pallet pressing device 220 is lowered to press down the pallet P onto the pallet base 213. By this process, the driven gear 208 and the transmission gear 218 are coupled to each other, and the rotation motion of the drive motor 211 is transmitted to the optical fiber 203 attached to the pallet P, through the timing belt 217, gears 218, 208 and the shaft member 206.

The method of centering is explained below. The shaft member 206 is made to be wobble-free, but if the attached optical fiber 203 wobbles, it is because the centers of the optical fiber 203 and the shaft member 206 are not coincident. To correct such a situation, the parallel sections 225a, 226a are pressed by the precision bolts 230 to force the workpiece 203 to move relative to the shaft member 206 within a plane at right angles to the shaft axis. Because the precision bolts are threaded at an inclined angle to the axis, one turn of the bolt produces a movement equal to a fractional portion of the thread pitch. For example, the thread pitch of an M2 screw is 0.4 mm per revolution, but the 30° angle of the bolt produces a pressing distance of 0.2 mm against the parallel sections 225a, 226a. The pressing process is continued gradually to align the center of the optical fiber 203 with the center of the shaft member 206.

To perform an etching process on the optical fiber 203 using the apparatus A, an energy beam from an energy beam source 201 is irradiated through a slit of a mask 202. By etching the optical fiber 203 while rotating it with the drive motor 211, a three-dimensional fine-structure is produced from the optical fiber 203.

Figure 20A:
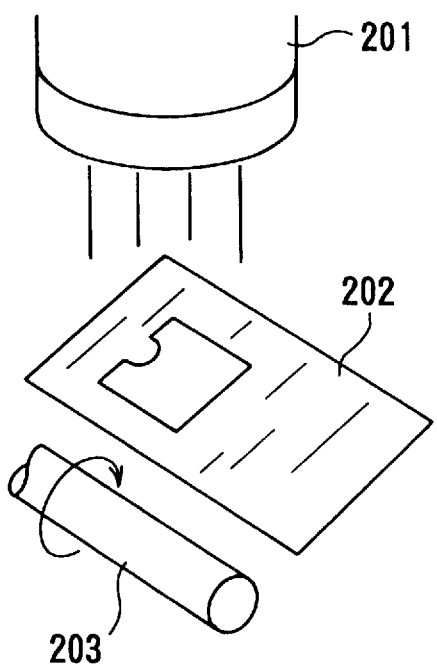
FIGS. 20A–20B illustrate an example of essential steps of using such processing apparatus.
Figure 20B:
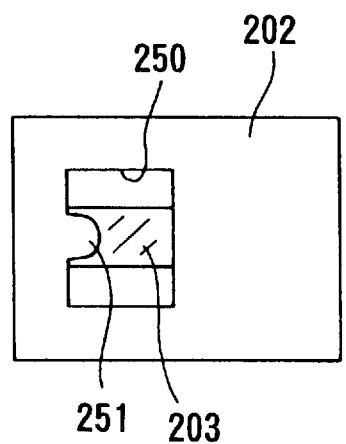
Figure 21:
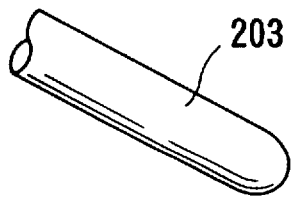
FIG. 21 shows an example of an optical fiber made by the method shown in FIGS. 20A–20B.

FIG. 20A shows an example of such arrangement. The optical fiber 203 is attached to the shaft member 206 of the pallet P, and the optical fiber 203 is exposed to FAB irradiation through a mask 202 having a fine pattern 251 protruding into an opening 250 as shown in FIG. 20B. The fine structure shown in FIG. 21 having a spherical end is produced on the optical fiber 203 by this method, and can be used as a lens in optical communications.

FIG. 22A shows an arrangement for production of a needle-tipped fine-structure, shown in FIG. 23, produced on an optical fiber 203 using a mask 202 having a long narrow slit pattern and irradiating with FAB. The product shown in FIG. 23 is a (needle-tipped) fiber probe 253 which is used in scanning secondary electron microscope (STM). In this process, the mask 202 mounted on a XY-stage 210 is reciprocated in the direction of the fiber axis, as illustrated in FIG. 22B, at a controlled speed so as to control the degree of exposure to the beam energy.

After processing is completed, the optical fiber 203 together with the pallet P is removed from the processing chamber 240, and is transported to the assembly chamber 241 to be assembled into a micro-working machine or the like devices of ultra-fine dimensions.

Figure 24A:
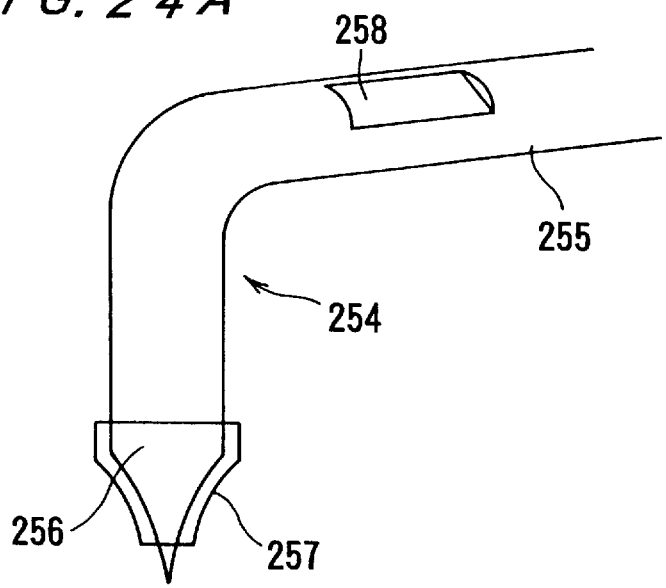
FIG. 24A–24C are illustrations of an example of a processing or assembling operation using the apparatus shown in FIG. 18.
Figure 24B:
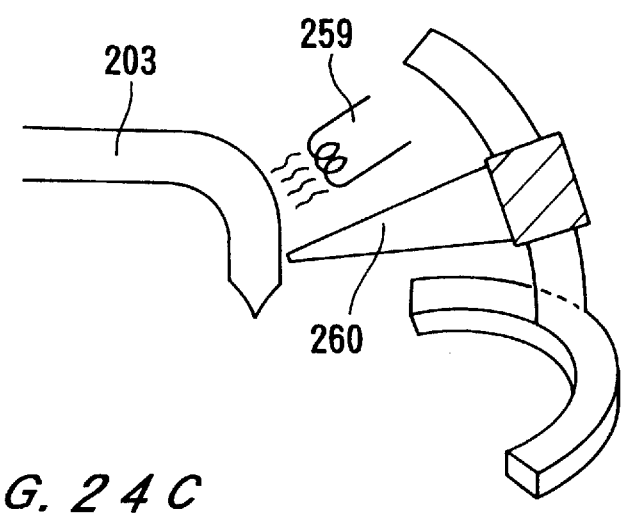
Figure 24C:
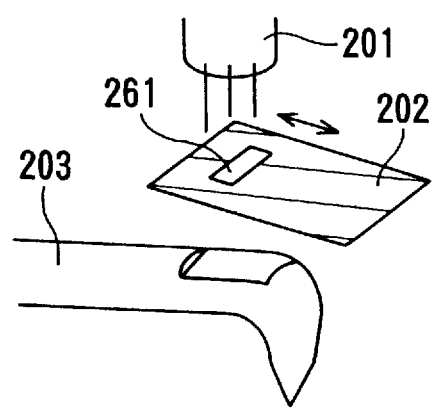

FIGS. 24A–24C illustrate fabrication steps for a probe 254 for use with both a scanning near-field optical microscope (SNOM) and an atomic force microscope (AFM). The former technique provides combined qualitative information regarding the distribution of light absorption and surface configuration, and the latter technique provides quantitative information regarding the surface configuration. Therefore, by using a probe 254 which can be used for both techniques, it is possible to obtain quantitative information regarding the distribution of light absorption for any given surface configuration. The probe 254 provides AFM information through a plate spring 255 having a needle tip 256 shown in FIG. 24A, and SNOM information is provided through a gold plated surface probe 257 and a gold plated reflection mirror 258 which are integrally formed in an optical fiber probe 254.

The probe 254 is produced in the processing chamber by heating an optical fiber 203 with a heater 259 to bend the tip using a bending jig 260 as illustrated in FIG. 24B. In the next step, fabrication of the reflection mirror 258 is carried out to polish the surface of the optical fiber 203 with an energy be am using a mask 202 having a narrow slit 261, as illustrated in FIG. 24C. Subsequently, this region is gold plated in the processing chamber.

Figure 25A:
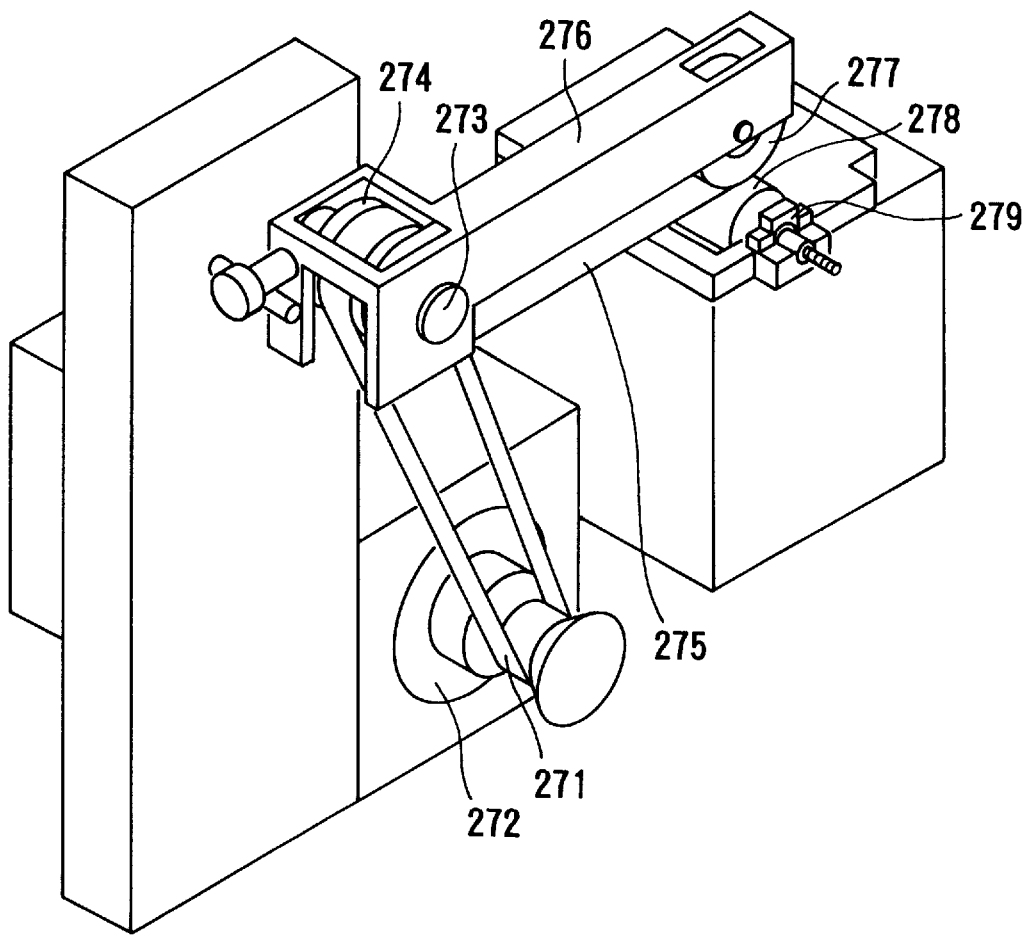
FIGS. 25A and 25B are perspective views of still another embodiment of a processing apparatus.

FIG. 25A shows another embodiment of a micro-pallet device of the present invention, having a friction-driven mechanism for the transmission of motor torque to the pallet. The rotational motion of drive motor 272 is transmitted to a shaft 273 through a timing belt 271, and is transmitted further to a roller 274 disposed at the fixed end of an arm 276. The arm 276 is free to rotate, and rotates with the roller 274 until it is stopped by a metal roller 278 provided on the pallet. In this device, the rotation of the arm 276 is converted to a pressing force of the roller 277 against the metal roller 278.

Figure 25B:
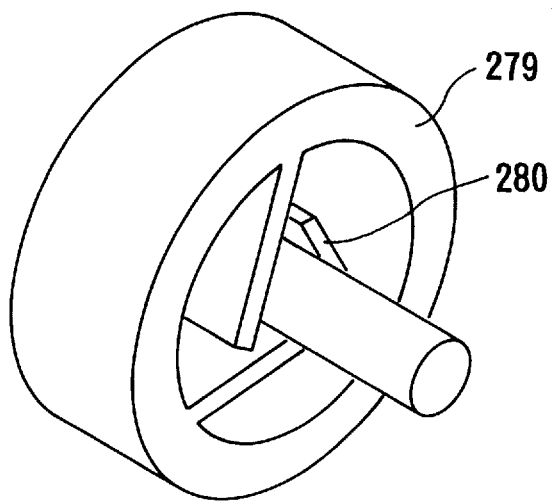

The metal roller 278 is thus driven by the frictional force of the timing belt 275. The metal roller 278 is supported by a bearing 279 shown in FIG. 25B. The entire structure of the bearing 279 is made as a unit by wire electric discharge machining, and is designed to hold a shaft with three plate spring members 280 pushing the shaft from different directions. This type of pre-stressed shaft configuration provides smooth precise rotation. There is some sliding between the plate springs 280 and the shaft, but the shaft rotates at about 10 rpm, and there is no danger of frictional wear.

What is claimed is:

1. A micro-working apparatus for performing microprocessing and/or assembling operations on a workpiece or workpieces to be disposed in a working area, said apparatus comprising:

a working device disposed in a working space surrounding said working area to perform an operation on at least one workpiece to be disposed in said working area;

positioning means for adjusting a relative position between said working device and the at least one workpiece disposed in said working area;

observation means for providing magnified images of the at least one workpiece disposed in said working area; and protection means for preventing contamination of said observation means caused by operation of said working device.

2. An apparatus as claimed in claim 1, wherein said observation means comprises at least two observation devices each providing a different field of view of the at least one workpiece.

3. An apparatus as claimed in claim 1, wherein said protection means comprises a masking device displaceably disposed in front of said observation means.

4. An apparatus as claimed in claim 1, wherein said positioning means comprises means for adjusting the position of said working device relative to the at least one workpiece disposed at said working area.

5. An apparatus as claimed in claim 4, wherein said positioning means comprises a circular guide member for guiding movement of said working device around said working area.

6. An apparatus as claimed in claim 4, wherein said positioning means further comprises means for adjusting the position of the at least one workpiece disposed at said working area relative to said working device.

7. An apparatus as claimed in claim 1, wherein said positioning means comprises means for adjusting the position of the at least one workpiece disposed in said working area relative to said working device.

8. An apparatus as claimed in claim 1, wherein said working device comprises an energy beam source for irradiating an energy beam toward the at least one workpiece disposed in said working area.

9. An apparatus as claimed in claim 1, wherein said working device comprises a micro-manipulator.

10. An apparatus as claimed in claim 1, wherein said working space comprises a hermetically sealed space.

11. An apparatus as claimed in claim 1, wherein said observation means comprises at least one observation device selected from the group consisting of optical, laser and electron microscopes.

12. An apparatus as claimed in claim 1, wherein said observation means is movable relative to the at least one workpiece disposed in said working area.

13. An apparatus as claimed in claim 12, wherein said observation means comprises at least two observation devices movable in rectilinear directions relative to said working space.

14. An apparatus as claimed in claim 12, wherein said observation means comprises at least two observation devices movable along circular guides.

15. A micro-working apparatus for performing microprocessing operations on a workpiece by use of an energy beam, said apparatus comprising:

a vacuum vessel;

a workpiece support member for supporting a workpiece in said vacuum vessel, said support member being rotatable about an axis;

an energy beam source for irradiating an energy beam toward a working position in said vacuum vessel;

observation means for observing an observation position different from said working position in said vacuum vessel; and means for rotating said support member about said axis and thereby for moving a workpiece supported on said support member between said working position, whereat said energy beam may perform a microworking operation on the workpiece, and said observation position, whereat the workpiece may be observed by said observation means.

16. An apparatus as claimed in claim 15, wherein said axis is substantially horizontal.

17. An apparatus as claimed in claim 15, wherein said axis is substantially vertical.

18. An apparatus as claimed in claim 15, wherein said observation means comprises at least two observation devices each providing a different field of view of said observation position.

19. An apparatus as claimed in claim 15, wherein said observation means comprises at least one observation device selected from the group consisting of optical, laser and electron microscopes.

20. An apparatus as claimed in claim 15, further comprising micro-movement means for achieving micro-positioning of the workpiece on said support member.

21. An apparatus as claimed in claim 15, wherein said energy beam comprises a beam selected from the group consisting of a fast atomic beam, an ion beam, an electron beam, an atomic beam, a molecular beam, a laser beam, and a radiation beam.

22. An apparatus as claimed in claim 15, further comprising means for supporting a mask at a position between said energy beam source and the workpiece supported on said support member to thereby mask the workpiece relative to said energy beam.

23. An apparatus as claimed in claim 22, comprising a plurality of exchangeable masks having different masking patterns.

24. An apparatus as claimed in claim 22, wherein said mask supporting means includes micro-movement means for micro-positioning said mask relative to said energy beam.

25. A micro-working apparatus for performing micro-processing and/or assembling operations on a workpiece or workpieces to be disposed in a working area, said apparatus comprising:
a working device disposed in a working space surrounding said working area to perform an operation on at least one workpiece to be disposed in said working area;
at least two observation means for providing magnified real-time images of progress of said operation from respective different fields of view; and
positioning means for adjusting a position of said working device relative to the at least one workpiece, said positioning means comprising a circular guide member for guiding movement of said working device around said working area.

26. An apparatus as claimed in claim 25, further comprising another circular guide member positioned coaxially of said circular guide member.

27. An apparatus as claimed in claim 26, wherein at least one said observation means is guided for movement along said another circular guide member.

28. An apparatus as claimed in claim 25, further comprising means for adjusting the position of the at least one workpiece disposed in said working area relative to said working device.

29. An apparatus as claimed in claim 28, wherein said working device comprises an energy beam source for irradiating an energy beam toward the at least one workpiece disposed in said working area.

30. An apparatus as claimed in claim 25, wherein said working device comprises a micro-manipulator.

31. An apparatus as claimed in claim 25, wherein said working space comprises a hermetically sealed space.

32. An apparatus as claimed in claim 25, wherein each said observation means comprises an observation device selected from the group consisting of optical, laser and electron microscopes.

* * * * *